United States Patent
Nakamura et al.

(10) Patent No.: US 7,902,934 B2
(45) Date of Patent: Mar. 8, 2011

(54) VARIABLE INDUCTOR, AND OSCILLATOR AND COMMUNICATION SYSTEM USING THE SAME

(75) Inventors: Takahiro Nakamura, Kokubunji (JP); Toru Masuda, Kokubunji (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 11/268,643

(22) Filed: Nov. 8, 2005

(65) Prior Publication Data

US 2006/0097811 A1 May 11, 2006

(30) Foreign Application Priority Data

Nov. 9, 2004 (JP) ................................. 2004-324657

(51) Int. Cl.
*H03B 5/08* (2006.01)
(52) U.S. Cl. ..................... 331/181; 331/117 FE; 331/167
(58) Field of Classification Search ............ 331/117 FE, 331/167, 181
See application file for complete search history.

(56) References Cited

U.S. PATENT DOCUMENTS

| 6,549,096 B2 | 4/2003 | Groves |
| 6,597,248 B2 | 7/2003 | Shirai |
| 6,621,365 B1 * | 9/2003 | Hallivuori et al. ............. 331/179 |
| 6,778,022 B1 * | 8/2004 | Zhang et al. ..................... 331/14 |
| 7,183,870 B2 * | 2/2007 | Takagi ....................... 331/177 V |
| 2004/0183606 A1 | 9/2004 | Komurasaki et al. |
| 2006/0033587 A1 * | 2/2006 | Cabanillas ................. 331/108 C |
| 2006/0055470 A1 * | 3/2006 | Luong et al. ................. 331/36 L |

FOREIGN PATENT DOCUMENTS

| JP | 54-133054 A | 10/1979 |
| JP | 59-39523 U | 3/1984 |
| JP | 60-12827 A | 1/1985 |
| JP | 63-228967 A | 9/1988 |
| JP | 2001-267845 A | 9/2001 |
| JP | 2001-320235 A | 11/2001 |
| JP | 2002-009544 | 1/2002 |
| JP | 2002-151953 | 5/2002 |
| JP | 2002-280222 | 9/2002 |
| JP | 2004-15387 A | 1/2004 |
| JP | 2004-140165 | 5/2004 |
| JP | 2004-254162 A | 9/2004 |
| JP | 2004-266718 A | 9/2004 |

OTHER PUBLICATIONS

"Understanding Semiconductor Devices" by Sima Dimitrijev., Oxford University Press, 2000., pp. 121-129.
"A Noise-Shifting Differential Colpitts VCO" by Aparicio, et al. IEEE Journal of Solid-State Circuits, vol. 37, No. 12, Dec. 2002. pp. 1728-1736.
"The Design of CMOS Radio-Frequency Integrated Circuits" by T. Lee, Cambridge University Press, 1998.494-501.

(Continued)

*Primary Examiner* — Robert Pascal
*Assistant Examiner* — James E Goodley
(74) *Attorney, Agent, or Firm* — Mattingly & Malur, P.C.

(57) ABSTRACT

There are provided a variable inductor with little degradation in quality factor, and an oscillator and a communication system using the variable inductor. An inductance controller comprising a reactance device with a variable device value, such as, for example, a variable capacitor, is connected to a secondary inductor, magnetically coupled to a primary inductor through mutual inductance. The inductance controller is provided with an inductance control terminal for receiving a control signal for controlling capacitance of the variable capacitor. Inductance of the primary inductor is varied by varying the capacitance by the control signal.

8 Claims, 23 Drawing Sheets

OTHER PUBLICATIONS

M. Straayer, et al., A Low-Noise Transformer-Based 1.7GHz CMOS VCO, 2002 IEEE International Solid-State Circuits Conference, Digest of Technical Papers, ISSCC, 2002 IEEE International, U.S., IEEE, Feb. 7, 2002, vol. 1, pp. 286-287.

D. Baek, et al., Analysis on Resonator Coupling and its application to CMOS Quadrature VCO at 8 GHz, 2003 IEEE Radio Frequency Integrated Circuits (RFIC) Symposium, U.S., IEEE, Jun. 10, 2003, pp. 85-88.

* cited by examiner

VARIABLE INDUCTOR, AND OSCILLATOR AND COMMUNICATION SYSTEM USING THE SAME

CLAIM OF PRIORITY

The present patent application claims priority from Japanese application JP 2004-324657 filed on Nov. 9, 2004, the content of which is hereby incorporated by reference into this application.

FIELD OF THE INVENTION

The present invention relates to a technology capable of varying inductance of an inductor, and in particular, to a variable inductor suited for integration in a semiconductor device, and an oscillator and a communication system using the variable inductor.

BACKGROUND OF THE INVENTION

With a communication system including a wireless communication system and a memory, an oscillator whose oscillation frequency is variable is an indispensable circuit. Along with progress in the development of the communication system, an oscillator with an oscillation frequency close to a GHz range has lately come into use. In the case of making up an oscillator by use of an LC resonator comprised of an inductor L and a capacitor C, inductance and capacitance become small at such a high frequency, so that the oscillator can be easily formed on a semiconductor substrate through integration with a transistor. In this case, for the inductor, use is made of a thin line formed in a shape square or circular, or in a spiral shape, and so forth while as the capacitor, use is made of a pn-junction capacitor (diode capacitor), a gate-source-drain capacitor (hereinafter referred to as "a MOS capacitor") of a MOS (Metal Oxide Semiconductor) transistor, a MIM (Metal Insulator Metal) capacitor formed between metal layers in a semiconductor device, and so forth. The structure and operation of the MOS capacitor have been disclosed in, for example, Non-patent Document 1: "Understanding Semiconductor Devices" by Sima Dimitrijev, published by Oxford University Press, in 2000, pp. 121 to 129.

Variation in frequency is executed by changing a control voltage applied to the diode capacitor and the MOS capacitor, and changing over among a plurality of the MIM capacitors, and by other means, and further, for the purpose of obtaining a wide frequency-tuning range, varying inductance is also executed.

As a technology for rendering inductance of integrated inductors variable, a technology for switching over inductance by switching over a whole length of the inductor by use of a switch using a linear region of a MOS transistor has been disclosed in, for example, Non-patent Document 1. Further, Patent Document 1; Japanese Patent Laid-open No. 2002-151953, has disclosed a technology whereby an inductor is made up of a primary inductor and a secondary inductor magnetically coupled thereto, and presence/lack of mutual inductance applied to the primary inductor is controlled by opening/closing the secondary inductor by use of a switch to thereby control inductance of the primary inductor. With the technology disclosed in Patent Document 1, control is made merely by opening/closing the secondary inductor, so that inductance is selectable for two values only, however, Patent Document 2; Japanese Patent Laid-open No. 2002-280222, has disclosed a variable inductor capable of selecting a plurality of inductances by selectively closing a plurality of open circuits each with a single loop winding. Further, Patent Document 3; Japanese Patent Laid-open No. 2004-140165, has disclosed a technology whereby an inductor is made up of a first inductor and a second inductor formed so as to have mutual inductance with the first inductor as with the case of Patent Documents 1, and 2, thereby rendering inductance variable by varying resistance of a variable resistor connected in series to the second inductor. Still further, Patent Document 4; Japanese Patent Laid-open No. 2002-9544, has disclosed a technology whereby a control inductor is disposed in the vicinity of an inductor used for an oscillator, and mutual inductance between both the inductors is varied by causing a control current to flow to the control inductor

SUMMARY OF THE INVENTION

A task facing the present invention is described hereinafter by taking an oscillator using an LC resonator as a target byway of example. FIG. 28 is a circuit diagram showing an example of a common differential LC resonator type voltage-controlled oscillator. The differential LC resonator type voltage-controlled oscillator comprises an LC resonator 10 and a negative conductance generator 1. The LC resonator 10 has inductors L11, L12, variable diode capacitor CV1, CV2, MOS capacitors CM11 to CM1N, CM21 to CM2N, used for trimming in order to vary a frequency stepwise, and parasitic capacitors (not shown) due to metal interconnects, and so forth. On the assumption that inductance of the inductors L11, L12 is L, capacitance of the diode capacitor CV1, CV2 is $C_V$, capacitance of the MOS capacitors CM11 to CM1N, CM21 to CM2N is $C_M$, and capacitance of the metal interconnect parasitic capacitors is $C_P$, an oscillation frequency $f_{OSC}$ of the differential LC resonator type voltage-controlled oscillator is represented by the following expression (1):

$$f_{osc} = \frac{1}{2\pi\sqrt{L(C_V + C_M + C_P)}} \qquad (1)$$

Frequency control is executed by controlling capacitance of the variable capacitors CV by a voltage applied to a frequency-tuning terminal VCONT. The trimming capacitance $C_M$ is capacitance used for the purpose of varying the frequency stepwise, and by a control voltage applied to terminals VTRM11 to VTRM1N, respectively, each of the MOS capacitors CM11 to CM1N, CM21 to CM2N, providing the trimming capacitance $C_M$ can have capacitances at two values, including a large capacitance and small capacitance. By use of N-pieces of the capacitors for trimming, the frequency can be set to a $2^N$-piece state. Further, since the trimming capacitance $C_M$ has a large rate of variation in capacitance, it is possible to implement a frequency-tuning range that cannot be obtained by use of only a diode normally having a small rate of variation in capacitance. In FIG. 28, a gate of each of the MOS capacitors is biased by a fixed bias voltage inputted to terminals VB2, respectively, and source drain of each of the MOS capacitors is controlled by the control voltage applied to the terminals VTRM11 to VTRM1N, respectively.

The capacitors for the trimming capacitance $C_M$ include a switching MIM capacitor changing over a fixed capacitor such as a MIM capacitor or the like, formed between metal layers in a semiconductor device, by use of a switch, besides the MOS capacitor changing over capacitance thereof by controlling a thickness of a depletion layer through control of a gate-source•drain voltage of a gate-source•drain capacitor of a MOS transistor, as described in the foregoing. The MOS capacitor is normally used in an accumulation state, and is capable of selecting capacitances at two values, large and small, depending on high/low of the gate-source•drain voltage.

With a configuration shown in FIG. 28, a wide frequency-tuning range can be implemented, however, capacitances that can be varied are not all capacitances for the LC resonator, that is, all capacitances of $C_V+C_M+C_P$, but are limited for the following reason. Since all the capacitances include a fixed capacitances $C_P$, variable capacitances become $C_P$ to $C_P+C_V+C_M$. Further, as variation of $C_V$ used in a normal silicon process represents about one third of the whole, the capacitance representing the remaining two thirds of the whole can be regarded as at fixed values. Accordingly, a variable width of the capacitance for the LC resonator is $C_P+\frac{2}{3}C_V$ to $C_P+C_V+C_M=\frac{1}{3}C_V+C_M$. In particular, in the case of high frequency at several GHz or higher, a ratio of the metal interconnect parasitic capacitance to the whole capacitance is high, so that the higher a radio frequency, the less a variable capacitance ratio becomes.

If an oscillator operating at an operation frequency of several GHz, and capable of coping with a plurality of applications and a plurality of communication systems can be provided, this will enable a cost of a semiconductor chip to be lowered, however, for that end, a wide frequency-tuning range is required, and since the frequency-tuning range will be limited owing to the metal interconnect parasitic capacitance even if capacitance only is varied, there emerges a need for a technology for rendering inductance variable. Hereinafter an inductor with variable inductance will be called a "variable inductor".

With the technology disclosed in Non-patent Document 1, since the MOS transistor is used as the switch, channel resistance between the source and drain of the MOS transistor is added in series to the inductors. Accordingly, power loss due to the channel resistance is significant. That is, there occurs degradation in quality factor (Q) of the resonator. With the technology disclosed in Patent Document 1, as well, the switch is used to vary the inductance, so that quality factor is degraded, and phase noise of an oscillation signal of a resonator is degraded. Further, with a technology as disclosed in Patent Document 2, the plurality of inductances can be selected, however, since a switch is used, quality factor similarly is degraded. With the technology disclosed in Patent Document 3, inductance can be successively varied by successively varying the resistance, however, degradation in quality factor is unavoidable because the resistor is used. With the technology disclosed in Patent Document 4, a constant current source is required to obtain the control current however, it is difficult to provide a constant current source that can be operated at a high frequency.

It is therefore an object of the invention to provide a variable inductor with little degradation in quality factor, and an oscillator and a communication system using the variable inductor.

To that end, the invention provides a variable inductor comprising a first inductor, a second inductor magnetically coupled to the first inductor through mutual inductance, and an inductance controller comprising a reactance device, the inductance controller being connected to the second inductor, wherein the inductance controller has an inductance control terminal for receiving a control signal for varying a device value of the reactance device, and as a result of variation in the device value of the reactance device, caused by the control signal, inductance of the first inductor varies. With the variable inductor according to the invention, the inductance can be varied by varying the device value of the reactance device, without causing loss, so that it is possible to obtain a high quality factor in comparison with that for a conventional case. Further, a capacitive device can be easily obtained in a semiconductor device, and is high in practical utility. Therefore, the capacitive device is preferably used as the reactance device causing the device value to vary.

Further, to that end, the invention provides an oscillator comprising a resonator including an inductor and a capacitor connected in parallel, and a negative conductance generator for generating negative conductance, the negative conductance generator being connected to the resonator, wherein the oscillator outputs a signal whose frequency is substantially determined by a resonance frequency of the resonator, wherein the inductor is a variable inductor whose inductance varies, wherein the resonance frequency of the resonator varies as a result of the variation in the inductance, and wherein the variable inductor described as above is the variable inductor according to the invention. By use of the variable inductor according to the invention, high in quality factor, it is possible to obtain an oscillator low in phase noise. Further, if a variable capacitor is adopted as the capacitor, an oscillator having a wide frequency-tuning range can be obtained.

Still further, to that end, the invention provides a communication system comprising a low-noise amplifier for amplifying a receive signal received by an antenna, a mixer for converting a frequency of an output signal of the low-noise amplifier, an oscillator for generating a local oscillator signal for conversion of the frequency, and outputting the local oscillator signal to the mixer, a demodulator for taking out a receive base band signal from an output signal of the mixer, a modulator for modulating a transmit base band signal and outputting two signals orthogonal in phase to each other, an orthogonal modulator for modulating the two signals orthogonal in phase to each other by use of the local oscillator signal outputted by the oscillator to thereby output an orthogonal modulation signal, a power amplifier for amplifying the orthogonal modulation signal, and a switch for supplying the receive signal received from the antenna to the low-noise amplifier at the time of receiving and supplying the orthogonal modulation signal outputted by the power amplifier to the antenna at the time of transmitting, wherein the oscillator described as above is the oscillator according to the invention using the variable inductor according to the invention. As a result of using the oscillator having low phase noise, and yet a wide frequency-tuning range, the communication system according to the invention will be capable of coping with a plurality of communication systems, and applications.

These and other objects and many of attendant advantages of the invention will be readily appreciated as the same becomes better understood by reference to the following detailed description when considered in connection with the accompanying drawings.

DETAILED DESCRIPTION OF THE PREFERRED EMBODIMENTS

Figure 1:
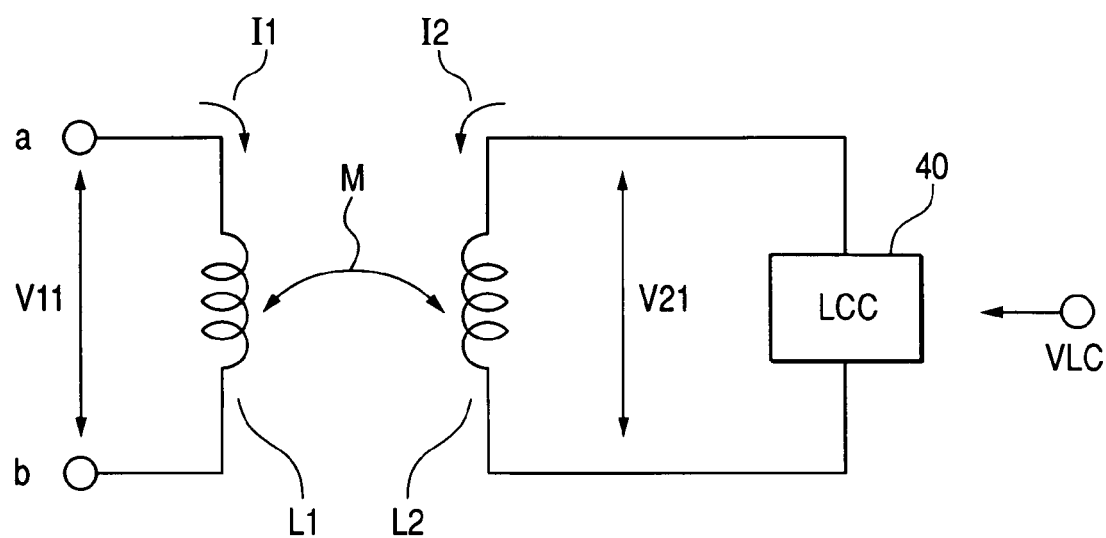
FIG. 1 is a circuit block diagram of a first embodiment of a variable inductor according to the invention.

Referring to the accompanying drawings, there will be described in detail hereinafter a number of embodiments of a variable inductor according to the invention, and an oscillator and a communication system using the same. In FIGS. 1, 2, 4 to 8, 10 to 27, and 29, parts corresponding to, or similar to each other are denoted by like reference numerals, respectively.

First Embodiment

A first embodiment of an inductor with a variable inductance (variable inductor), according to the invention, is described with reference to FIGS. 1, and 2. First, the basic configuration of the variable inductor according to the invention is shown in FIG. 1. The variable inductor according to the invention comprises a primary inductor (first inductor) L1, a secondary inductor (second inductor) L2, magnetically coupled thereto through mutual inductance M, and an inductance controller (LCC) 40 provided with an inductance control terminal VLC for controlling inductance of the inductor L1.

Assuming that an amplitude and a phase of an alternating current I1 flowing through the inductor L1 are designated $I_{A1}$, $\theta_1$, respectively, and an amplitude and a phase of an alternating current I2 flowing through the inductor L2 are designated $I_{A2}$, $\theta_2$, respectively, the alternating current I1 and the alternating current I2 are expressed by the following expressions (2) and (3), respectively:

$$I1 = I_{A1} \cdot \exp(j\theta_1) \quad (2)$$

$$I2 = I_{A2} \cdot \exp(j\theta_2) \quad (3)$$

Assuming that a voltage amplitude of an alternating voltage V11 applied to both ends of the inductor L1 is designated $V_{A1}$, a voltage amplitude of an alternating voltage V21 applied to both ends of the inductor L2 is designated $V_{A2}$, self-inductances of the inductors L1, L2 are designated $L_{i1}$, $L_{i2}$, respectively, and angular frequency is designated $\omega$, $V_{A1}$ is expressed by the following expression (4):

$$V_{A1} = j\omega L_{i1} I_{A1} + j\omega M I_{A2} \exp\{j(\theta_1 - \theta_2)\} \quad (4)$$

Accordingly, an effective inductance $L_{\textit{eff}}$ between terminals a, and b is expressed by the following expression (5):

$$L_{\textit{eff}} = L_{i1} + \frac{I_{A2}}{I_{A1}} \cdot M \cos(\theta_1 - \theta_2) \quad (5)$$

It therefore follows that it is possible to render the effective inductance $L_{\textit{eff}}$ variable if the amplitude $I_{A2}$ of the alternating current I2, or a phase $(\theta_1 - \theta_2)$ can be controlled by the inductance controller 40. Further, a reactance device is used in the inductance controller 40, and by varying a device value of the reactance device, it is possible to control $I_{A2}$, or $(\theta_1 - \theta_2)$. Because the reactance device has no loss, the inductance can be rendered variable with degradation in quality factor being controlled to a low level, so that it is possible to obtain a high quality factor as compared with that in a conventional case. With the inductance controller 40, the value of the reactance device is caused to vary by inputting a control signal generated by a voltage, a current, or a pulse to the inductance control terminal VLC to thereby control the above-described $I_{A2}$, or $(\theta_1 - \theta_2)$. Since $(\theta_1 - \theta_2)$ expresses a difference in phase, the same can be expressed as delay time. A capacitance device serving as the reactance device varying the device value thereof can be obtained with ease in a semiconductor device, and has high practical utility.

Figure 2:
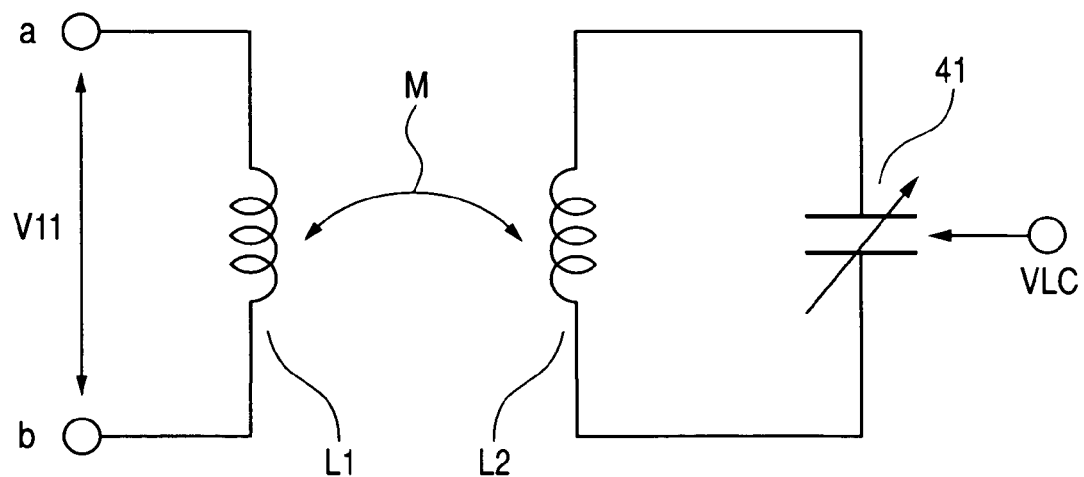
FIG. 2 is a circuit diagram of the first embodiment of the variable inductor according to the invention.

With the first embodiment of the variable inductor according to the invention, shown in FIG. 2, a variable capacitor (CLV) is used in an inductance controller 41. The inductance controller 41 has an inductance control terminal VLC for controlling a capacitance $C_{LV}$ of the variable capacitor. A control signal for varying the capacitance $C_{LV}$, generated by a voltage, a current, or a pulse, is applied to the inductance control terminal VLC.

The operation of the variable inductor of the above-described configuration is described hereinafter.

An alternating voltage V11 applied across both ends of an inductor L1 is expressed by the following expression (6):

$$L_{eff} = L_{i1} + \frac{I_{A2}}{I_{A1}} \cdot M \cos(\theta_1 - \theta_2) \quad (6)$$

Further, since an inductor L2 and CLV constitute a loop circuit, a potential around the loop becomes zero. That is, the following expression (7) holds:

$$0 = j\omega L_{i2} I2 + j\omega M I1 + \frac{I2}{j\omega C_{LV}} \quad (7)$$

Therefore, based on expression (7), an alternating current I2 flowing through the inductor L2 is expressed by the following expression (8):

$$I2 = \frac{\omega^2 M C_{LV} \cdot I1}{1 - \omega^2 L_{i2} C_{LV}} \quad (8)$$

Based on the expression (8), it follows that an amplitude of the alternating current I2 varies by varying the voltage, current, or pulse, applied to the inductance control terminal VLC to thereby vary the capacitance $C_{LV}$. By substituting the expression (8) for the expression (6), the following expression (9) is found.

$$V11 = \left( j\omega L_{i1} + j\omega M \frac{\omega^2 M C_{LV}}{1 - \omega^2 L_{i2} C_{LV}} \right) \cdot I1 = Z_{eff} I1 \quad (9)$$

where $Z_{eff}$ is an effective impedance between terminals a, b. Accordingly, $L_{eff}$ is expressed by the following expression (10):

$$L_{eff} = \text{Im}[Z_{eff}]/\omega = L_{i1} + \frac{\omega^2 M^2 C_{LV}}{1 - \omega^2 L_{i2} C_{LV}} \quad (10)$$

Figure 3:
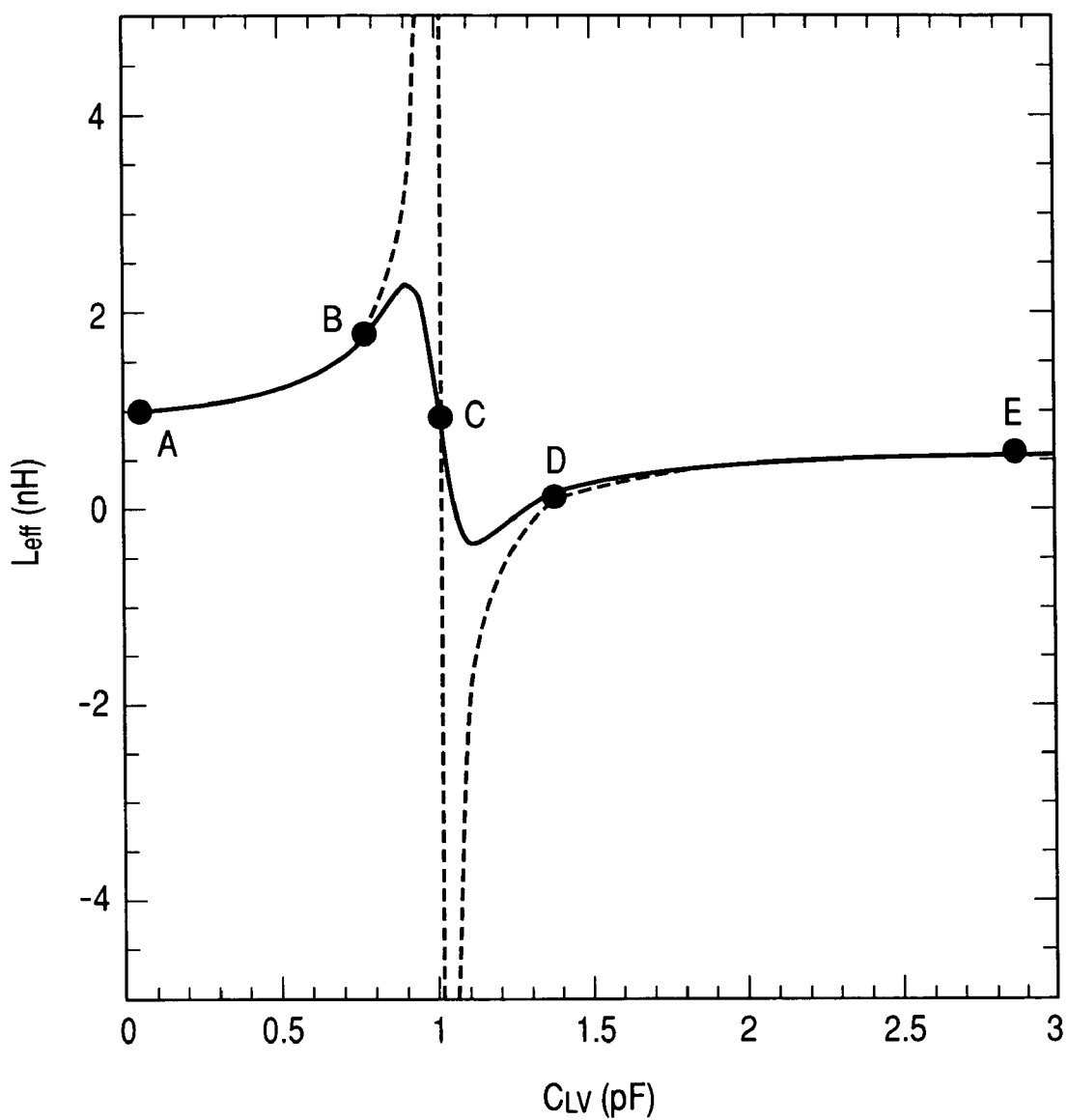
FIG. 3 is a graph illustrating inductance's dependency on capacitance of the variable inductor according to the invention.

As shown in the expression (10), $L_{eff}$ can be rendered variable by varying the capacitance $C_{LV}$ of the variable capacitor CLV, that is, by varying the amplitude of the alternating current I2. A dotted line in FIG. 3 indicates the effective inductance $L_{eff}$'s dependency on $C_{LV}$ at a frequency of 5 GHz when $L_{i1}$=1 nH, $L_{i2}$=1 nH, and M=0.5 nH. As $C_{LV}$ is increased, so the effective inductance $L_{eff}$ is increased in accordance with the expression (10). When $C_{LV}$ reaches $1/\omega^2 L_{i2}$, the denominator of the second term of the expression (10) is found at 0, so that the effective inductance $L_{eff}$ undergoes divergence, and then, undergoes reversal along the axis of $L_{eff}$=1 nH, and takes −∞. As $C_{LV}$ is further increased, the effective inductance $L_{eff}$ is increased, and converges to $L_{eff}$=0.75 nH (=$L_{i1} - M^2/L_{i2}$) where $C_{LV}$ is at ∞. Since the dotted line in FIG. 3 represents the case of using an ideal inductor and capacitor, having no resistance component, and no loss, $L_{eff}$ undergoes divergence at $C_{LV}$=$1/\omega^2 L_{i2}$, however, because there exist resistance components (parasitic resistance), such as resistance of metal interconnects making up an inductor, variation in $L_{eff}$, in the vicinity of $C_{LV}$=$1/\omega^2 L_{i2}$, becomes moderate in the case of an actual circuit.

Figure 4:
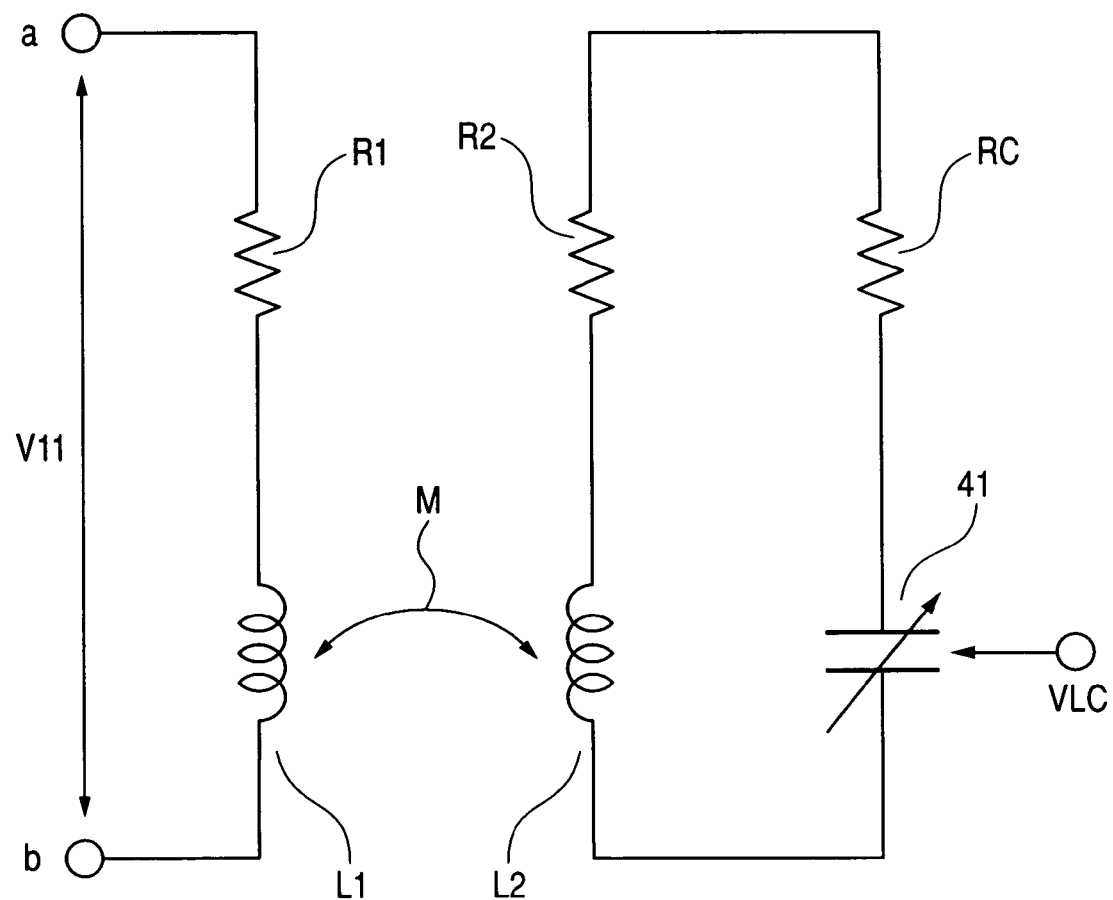
FIG. 4 is a circuit diagram of a second embodiment of a variable inductor according to the invention.

As shown in FIG. 4, parasitic resistors R1, R2, and RC are connected in series to resistance of an inductor L1, resistance of an inductor L2, and a capacitor CLV, respectively, and assuming that respective resistances of parasitic resistors R1, R2, and RC are $R_1$, $R_2$, and $R_C$, an effective inductance $L_{eff}$ and an effective resistance $R_{eff}$ are expressed by the following expressions (11), (12), respectively.

$$L_{eff} = L_{i1} + \frac{\omega^2 M^2 C_{LV} \cdot (1 - \omega^2 L_{i2} C_{LV})}{(1 - \omega^2 L_{i2} C_{LV})^2 + \omega^2 (R_2 + R_C)^2 C_{LV}^2} \quad (11)$$

$$R_{eff} = R_1 + \frac{\omega^4 M^2 (R_2 + R_C) C_{LV}^2}{(1 - \omega^2 L_{i2} C_{LV})^2 + \omega^2 (R_2 + R_C)^2 C_{LV}^2} \quad (12)$$

A curve indicated by a solid line in FIG. 3 shows $L_{eff}$'s dependency on $C_{LV}$ when the parasitic resistors are inserted in series in the inductor L1, the inductor L2, and the variable capacitor CLV of circuits in FIG. 2, respectively, as shown in FIG. 4. Herein, $R_1$=1.50, $R_2$=1.50, and $R_C$=1.50. In this case, variation of $L_{eff}$ in the vicinity of $C_{LV}$=$1/\omega^2 L_{i2}$, becomes moderate. By causing the capacitance $C_{LV}$ to vary successively from a point A to a point B in FIG. 3, it is possible to render $L_{eff}$ successively variable. Also, between points D and E in FIG. 3, similar variation can be effected.

The parasitic resistance of the capacitor can be kept at a relatively low value, and between the points A, B, and the points D, E, the variable inductor according to the present embodiment can obtain a high quality factor as compared with that for the conventional case. However, in the vicinity of a point C in FIG. 3, the inductance varies largely, but a quality factor is degraded. This is attributable to the respective parasitic resistances of the inductor L2, and the variable capacitor CLV. Accordingly, if the quality factor is a matter of concern, $L_{eff}$ in the vicinity of the point C in FIG. 3 is not adopted.

Figure 5:
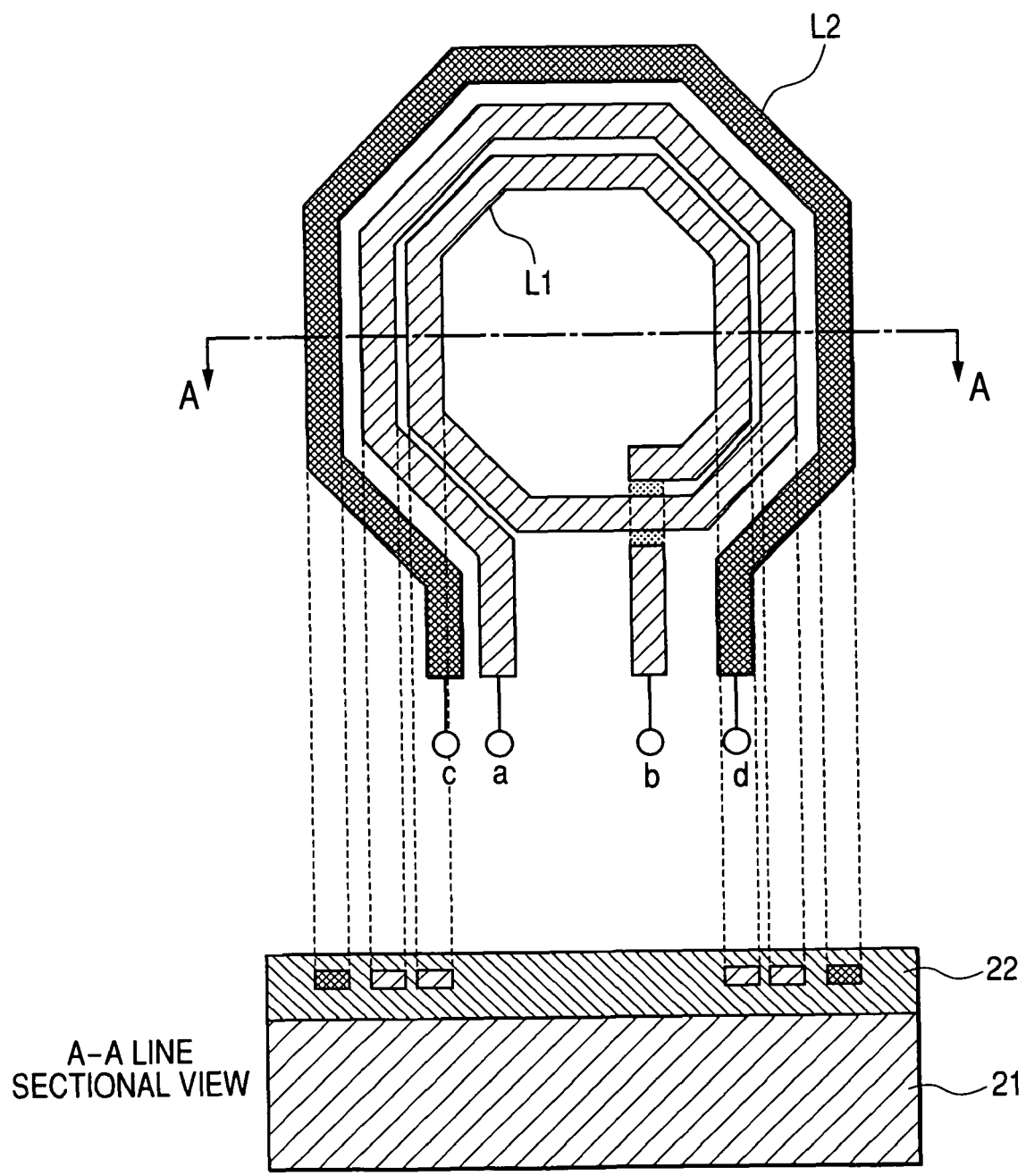
FIG. 5 is a block diagram of the variable inductor according to the second embodiment, showing inductors disposed on a semiconductor device.

FIG. 5 is a block diagram of inductors L1, L2 on a semiconductor device, according to the present embodiment. The inductor L1 is a two-turn spiral inductor embedded in an insulator layer 22 formed over a semiconductor substrate 21, and the inductor L2 is a single-turn inductor embedded in the insulator layer 22. As shown in FIG. 5, the inductors L1, L2 are disposed so as to be adjacent to each other. As a result, AC magnetic fluxes induced by supplying an alternating current to the inductors L1, L2, respectively, are interlinked with each other, whereupon mutual inductance M acts between the inductors L1, L2. Points a, b in FIG. 5 correspond to points a, and b in FIG. 2. A variable capacitor provided with an inductance control terminal is connected between a point c and a point d, in FIG. 5. A part of the inductor L1, close to the point b in FIG. 5, (not shown in section) is formed so as to be at a different level in the insulator layer 22 to avoid contact at an intersection.

Even if either the point c or the point d is grounded in an AC-manner, similar effects can be obtained. Further, as to shapes of the inductors, shown in FIG. 5, the inductor L1 may be a single-turn inductor, or may be a spiral inductor with at least two-turns. In the case of using the single-turn inductor, resistance of the inductor made of metal can be lowered by increasing thickness of metal interconnects, thereby enhancing a quality factor. In the case of using the spiral inductor with at least two-turns, mutual inductance is added between respective multi-turn inductors making up the spiral inductor, thereby enabling inductance to be increased, and a quality factor to be enhanced. The inductor L2 also may be a spiral inductor with at least two-turns, in which case it is possible to increase the mutual inductance M acting between the inductors L1, L2, thereby increasing a variation amount of an effective inductance $L_{eff}$. Further, in the case of using a differential variable inductor, a public known center-tapped inductor can be substituted for the inductors L1, L2, so that an area occupied by the inductor can be reduced.

Figure 6:
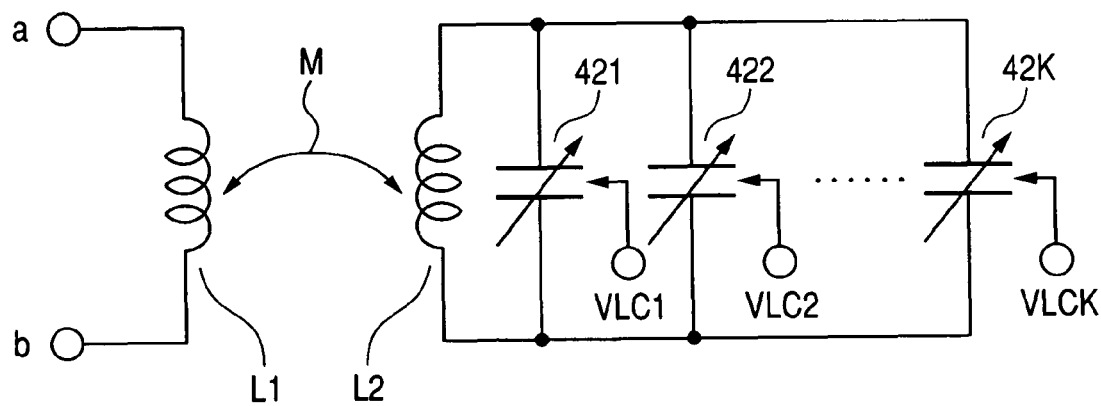
FIG. 6 is another circuit diagram of the second embodiment of the variable inductor according to the invention.

FIG. 6 is a circuit diagram of a second embodiment of the variable inductor according to the invention. An inductance controller according to the present embodiment is made up so as to include K-pieces (K is a positive integer) of variable capacitors 421 to 42K. The variable capacitors 421 to 42K are capacitors capable of changing over among large and small capacitances by a voltage, a current, or a pulse as inputted to control terminals VLC1 to VLCK, with which the variable capacitors 421 to 42K are provided, respectively. Capacitance can be changed over stepwise (in respective $2^K$ states) through changeover among K-pieces of the capacitors.

If it is set such that the capacitance can be subdivided between the points A, B in FIG. 3, inductance can be changed over stepwise between the points A, B in FIG. 3. A similar operation can be carried out between the points D, E in FIG. 3. Further, by changing over the capacitance between the points A to E, it is possible to change over the inductance in a wider range, however, as previously described, in the vicinity of the point C in FIG. 3, the quality factor is degraded, so that if the quality factor becomes a matter of concern, use of $L_{eff}$ in the vicinity of the point C in FIG. 3 is to be avoided.

The inductors L1, L2, disposed on the semiconductor device, according to the present embodiment, are the same in configuration as that for the first embodiment shown in FIG. 5.

Third Embodiment

Figure 7:
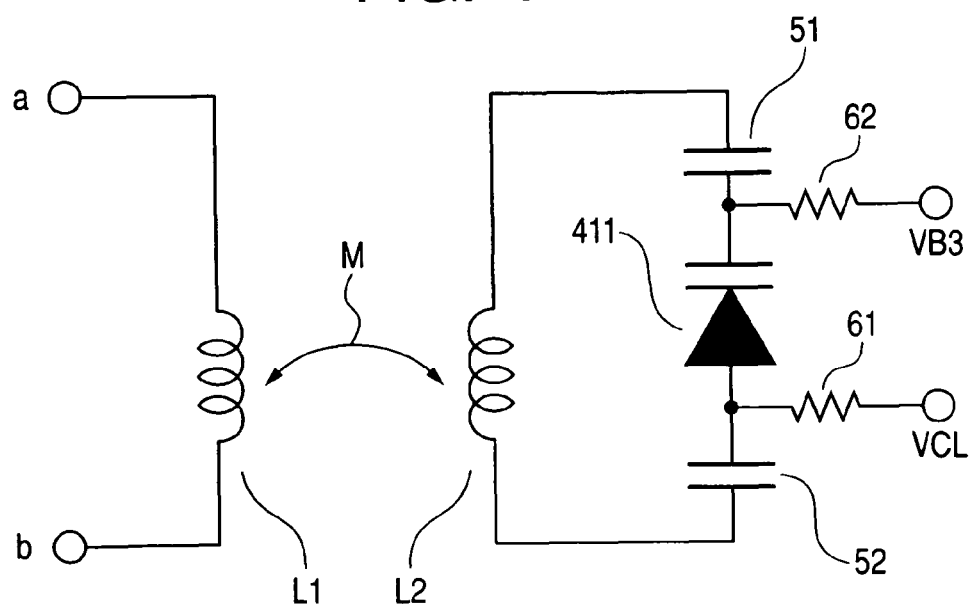
FIG. 7 is a circuit diagram of a third embodiment of a variable inductor according to the invention.

FIG. 7 is a circuit diagram of a third embodiment of a variable inductor according to the invention. A pn-junction capacitor 411 made of semiconductors is substituted for the variable capacitor adopted for the first and second embodiments, respectively. A voltage applied across both ends of the pn-junction capacitor 411 is controlled to thereby control a capacitance, and then inductance. By controlling the capacitance, it is possible to cause the inductance to vary successively between the points A, B, or the points D, E, shown in FIG. 3. In FIG. 7, reference numerals 51, 52 each denote a capacitor for blocking a direct current, and reference numerals 61, 62 each denote a resistor for blocking high-frequency leakage. A fixed bias voltage is applied to a terminal VB3, and a control voltage is applied to a terminal VCL. Further, inductors L1, L2, the pn-junction capacitor 411, and peripheral elements thereof can be integrated together to be formed on one and the same semiconductor device.

Fourth Embodiment

Figure 8:
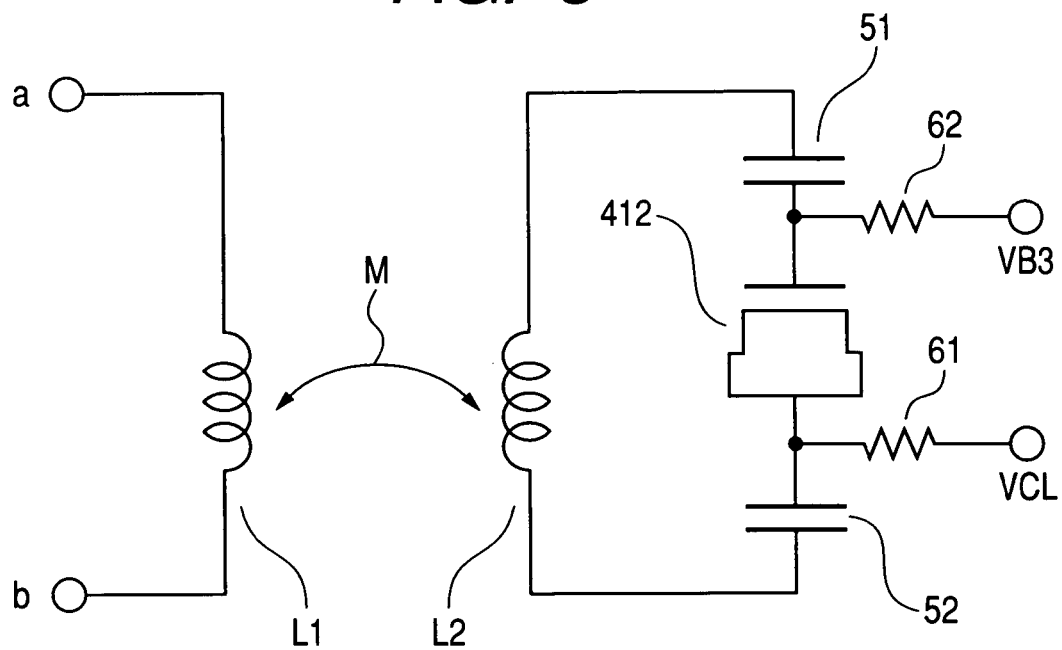
FIG. 8 is a circuit diagram of a fourth embodiment of a variable inductor according to the invention.

FIG. 8 is a circuit diagram of a fourth embodiment of a variable inductor according to the invention. A MOS capacitor (gate capacitor) of a MOS transistor 412 is formed in place of the variable capacitor adopted for the first and second embodiments, respectively. A gate-to-source drain voltage is controlled to thereby control a capacitance, and then inductance. By applying a fixed bias voltage to a terminal VB3, and a control voltage to a terminal VLC to thereby control the capacitance, it is possible to cause the inductance to vary successively between the points A, B, or the points D, E, shown in FIG. 3.

In this case, the MOS capacitor is preferably operated in an accumulation state. By use of the gate capacitor, that is, the MOS capacitor of the MOS transistor, operating in such a manner, it is possible to obtain a larger variation in capacitance than for the case of using the pn-junction capacitor shown in FIG. 7. Accordingly, an inductance variable range can be expanded.

Figure 9:
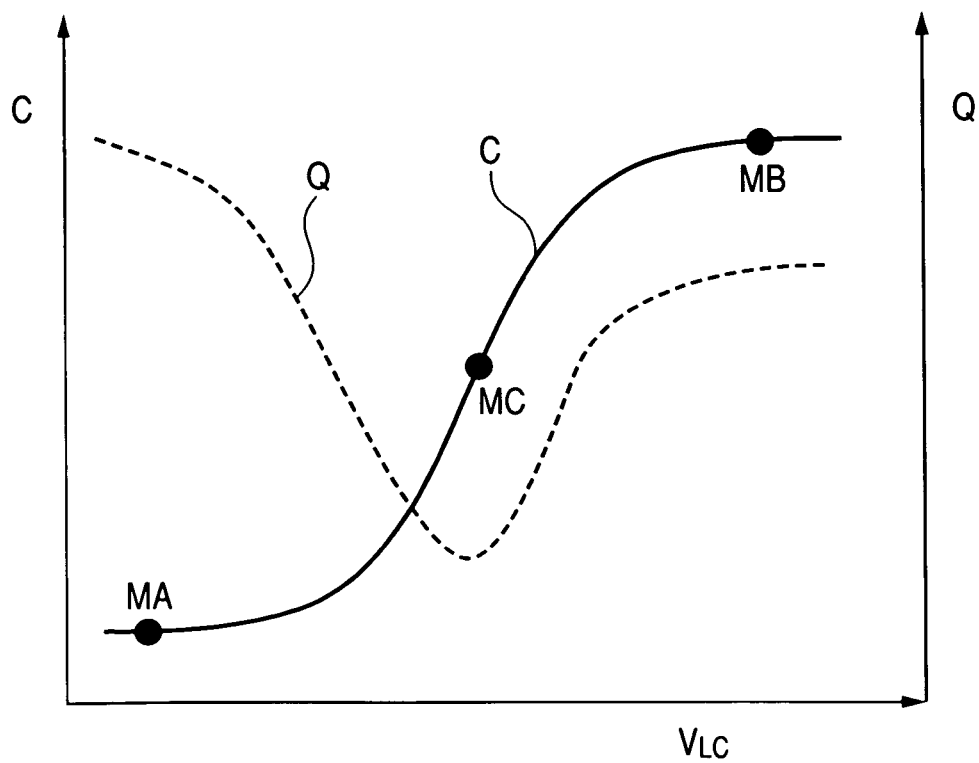
FIG. 9 is a graph illustrating MOS capacitance's, dependency on a gate-to-source•drain voltage.

FIG. 9 shows voltage dependencies of the capacitance (C) of the MOS capacitor and the MOS capacitor quality factor (Q). In FIG. 9, the horizontal axis indicates voltage at the terminal VLC for the control voltage, a solid line indicates the capacitance C, and a broken line the quality factor Q. As shown in FIG. 9, at a point MC of the line indicating the voltage dependency of the capacitance of the MOS capacitor, that is, in a transition region where the capacitance varies largely, the quality factor is degraded. On the other hand, in regions where the capacitance varies small, such as at points MA, MB, the quality factor is found relatively excellent, so that the MOS capacitor is suitable for use in place of the variable capacitor according to the second embodiment of the invention. Accordingly, as shown in FIG. 10, by substituting the MOS capacitors 431 to 43K for the variable capacitor according to the second embodiment, it is possible to implement a preferable variable inductor.

Figure 10:
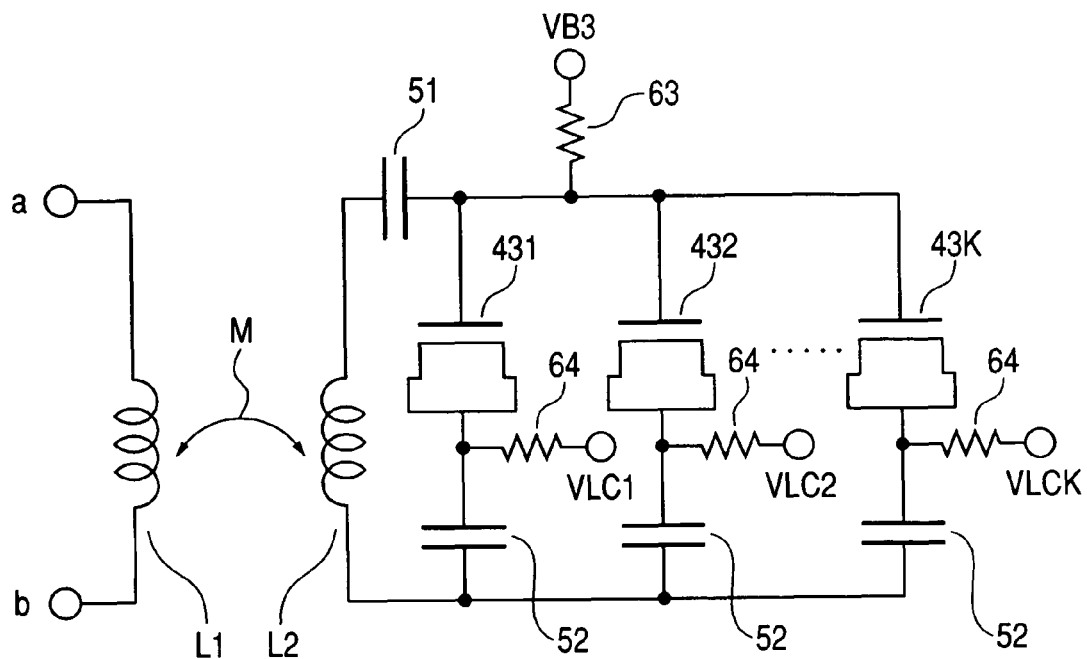
FIG. 10 is another circuit diagram of the fourth embodiment of the variable inductor according to the invention.

In FIGS. 8, and 10, a gate of the MOS capacitor is biased by the bias voltage inputted to the bias voltage terminal VB3, and the source drains are used as the control voltage terminals VLC, VLC1 to VLCK, respectively, however, even if the source-drains are biased by the bias voltage inputted to the bias voltage terminal VB3, and the gate is used as each of the control voltage terminals, to the contrary, there will be no change in advantageous effects as obtained.

Further, inductors L1, L2, the MOS transistor 412, and peripheral elements thereof can be integrated together to be formed on one and the same semiconductor device.

Fifth Embodiment

Figure 11:
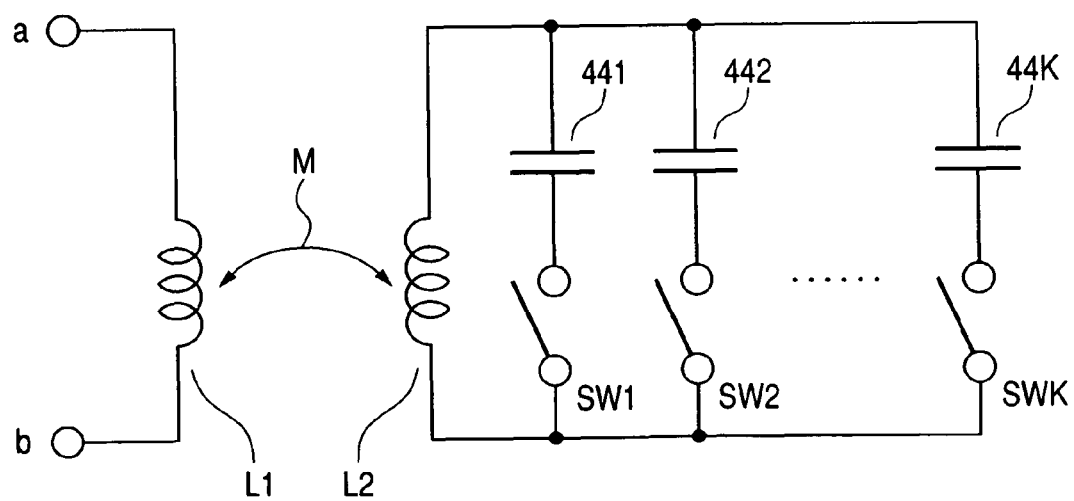
FIG. 11 is a circuit diagram of a fifth embodiment of a variable inductor according to the invention.

FIG. 11 is a circuit diagram of a fifth embodiment of a variable inductor according to the invention. With the present embodiment, the variable capacitor adopted for the second embodiment is comprised of K-pieces of fixed capacitors 441 to 44K, each being a MIM capacitor, formed between metal layers in a semiconductor, with an insulator interposed therebetween, and switches SW1 to SWK, connected in series to the fixed capacitors, respectively. A capacitance can be variously changed over by opening/closing the respective switches. For each of the switches, use is made of a MOS transistor to enable a low parasitic resistance to be obtained, and function for a variable capacitor can be achieved by switching over a gate-source voltage upon reaching a threshold voltage. In this case, however, because a parasitic capacitance exists between the gate and substrate of the MOS transistor, between the metal layer and the substrate of the MIM capacitor, and so forth, the capacitance does not turn zero even when the switch is open, so that a small capacitance remains. The switching-over of the gate-source voltage is executed by applying a high or low voltage to the gate upon reaching the threshold voltage. Further, in the case of intermittently varying inductance, a pulse is used to thereby utilize variation in pulse amplitude, high or low. Further, in the case of executing opening/closing of the switches by inputting a current, variation in inductance is implemented by presence/lack of the current.

Subsequently, there is described hereinafter an LC resonator type oscillator using the variable inductor according to the invention, described as above.

Sixth Embodiment

Figure 12:
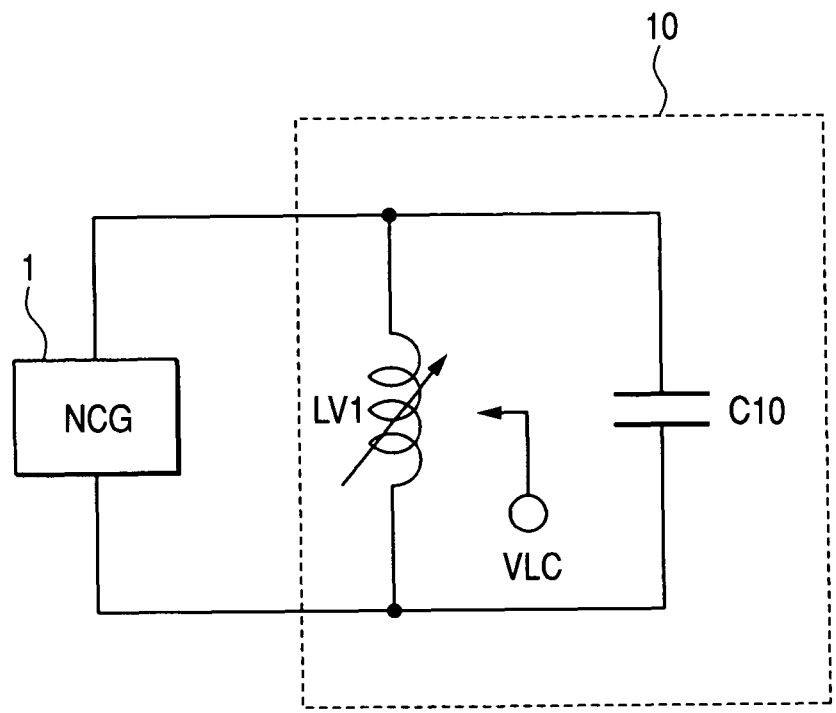
FIG. 12 is a block diagram showing a sixth embodiment of an oscillator according to the invention.

FIG. 12 is a block diagram showing a sixth embodiment by an oscillator according to the invention. The oscillator according to the present embodiment includes a negative conductance generator (NCG) 1 for generating a negative conductance, and an LC resonator 10. The resonator 10 comprises a fixed capacitor C10, and a variable inductor LV1 identical to any of the variable inductors, as previously described with reference to the first to fifth embodiments, respectively. Inductance of the variable inductor LV1 is controlled by a control signal generated by a voltage, current, or pulse, inputted to an inductance control terminal VLC, thereby controlling an oscillation frequency. The fixed capacitor C10 of the resonator 10 can be made up in a semiconductor device such that a quality factor becomes high in comparison with a variable capacitor, thereby enabling phase noise to be lowered.

Seventh Embodiment

Figure 13:
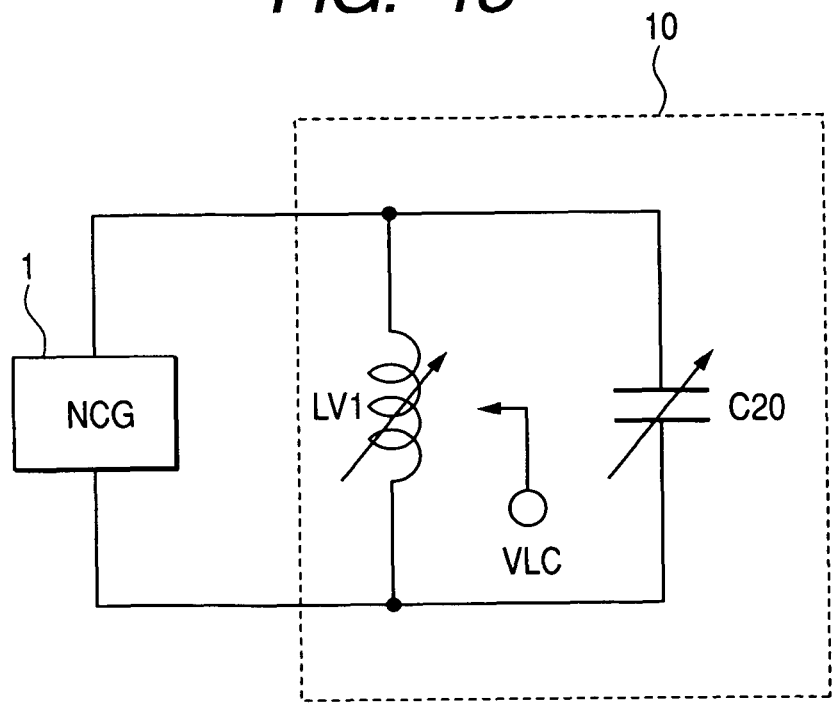
FIG. 13 is a block diagram showing a seventh embodiment of an oscillator according to the invention.

FIG. 13 is a block diagram showing a seventh embodiment by an oscillator according to the invention. The oscillator according to the present embodiment includes a negative conductance generator 1 for generating a negative conductance; and an LC resonator 10. The resonator 10 comprises a variable capacitor C20, and a variable inductor LV1 identical to any of the variable inductors, as previously described with reference to the first to fifth embodiments, respectively. Inductance of the variable inductor LV1 is controlled by a control signal generated by a voltage, current, or pulse, inputted to an inductance control terminal VLC, thereby controlling an oscillation frequency. Further, the oscillation frequency can also be controlled by controlling a capacitance of the variable capacitor C20. Since a variable capacitor is generally lower in quality factor than a fixed capacitor, phase noise of the oscillator according to the present embodiment is degraded in comparison with that for the case of the oscillator shown in FIG. 12, however, with the oscillator according to the present embodiment, it is possible to considerably expand a frequency-tuning range.

Eighth Embodiment

Figure 14:
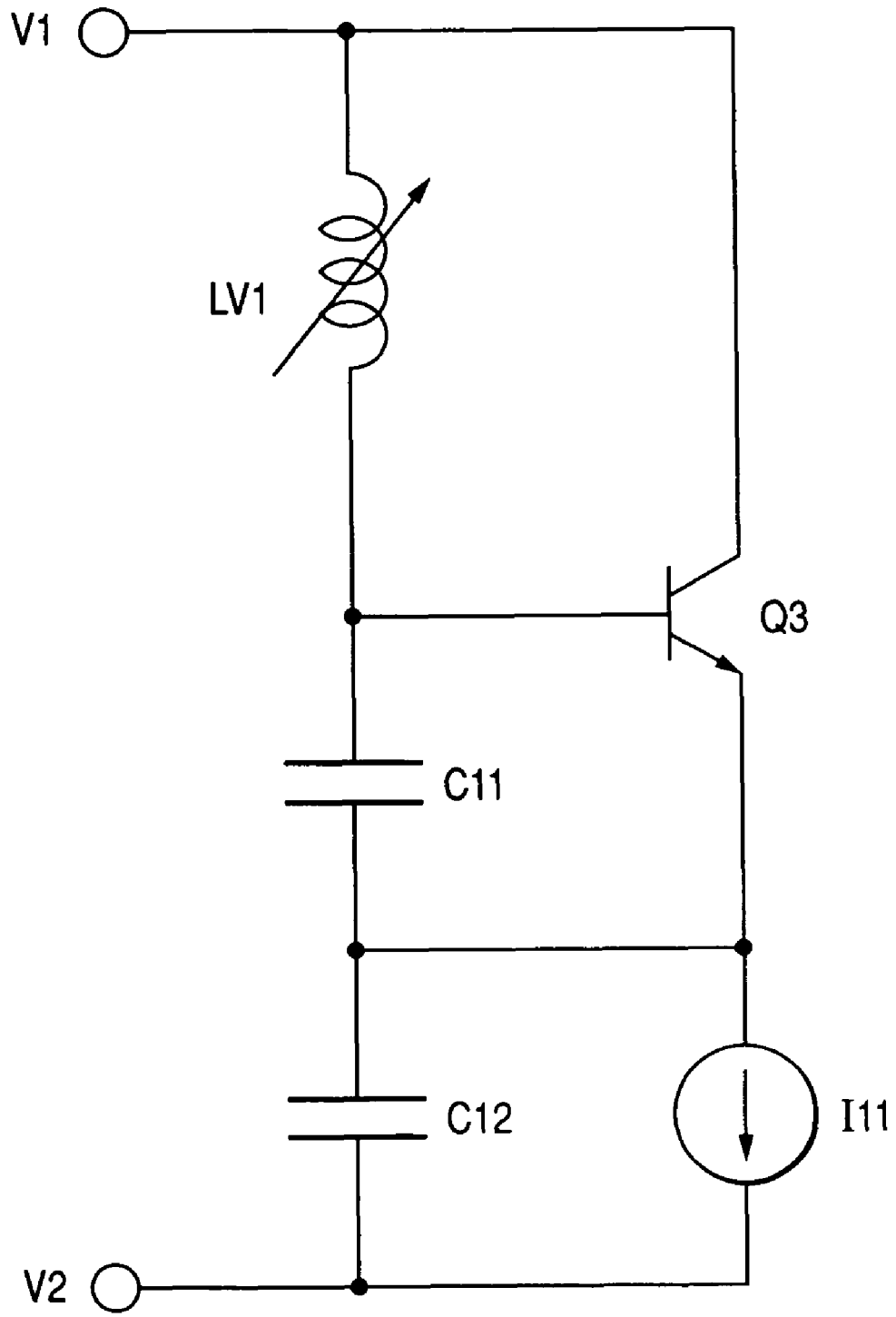
FIG. 14 is a circuit diagram of an eighth embodiment of an oscillator according to the invention.

FIG. 14 is a circuit diagram of an eighth embodiment by an oscillator according to the invention. The oscillator according to the present embodiment is the same in configuration as the well-known Colpitts oscillator. The oscillator according to the present embodiment includes a bipolar transistor Q3 having a collector connected to a first constant voltage terminal V1, and an emitter connected to a second constant voltage terminal V2 via a constant current source I11, a capacitor C11 having one end connected to a base of the bipolar transistor Q3, and the other end connected to the emitter of the bipolar transistor Q3, a capacitor C12 having one end connected to the emitter of the bipolar transistor Q3, and the other end connected to the second constant voltage terminal V2, and a variable inductor LV1 identical to any of the variable inductors, as previously described with reference to the first to fifth embodiments, respectively, having one end connected to the base of the bipolar transistor Q3, and the other end connected to the first constant voltage terminal V1.

With the present embodiment, an oscillation frequency is substantially determined by a resonance frequency of a resonator, generated by a capacitance due to series connection of the variable inductor LV1, the capacitor C11, and the capacitor C12. Further, a negative conductance generator 1 is formed by an action of the transistor, against the resonator.

By controlling inductance of the variable inductor LV1, it is possible to control the oscillation frequency. Further, if a variable capacitor is adopted for either the capacitor C11, or the capacitor C12, or both thereof, this will enable a wider frequency-tuning range to be obtained. The oscillator according to the present embodiment is advantageous in that the same can be operated with less current consumption owing to operation in a single phase.

Ninth Embodiment

Figure 15:
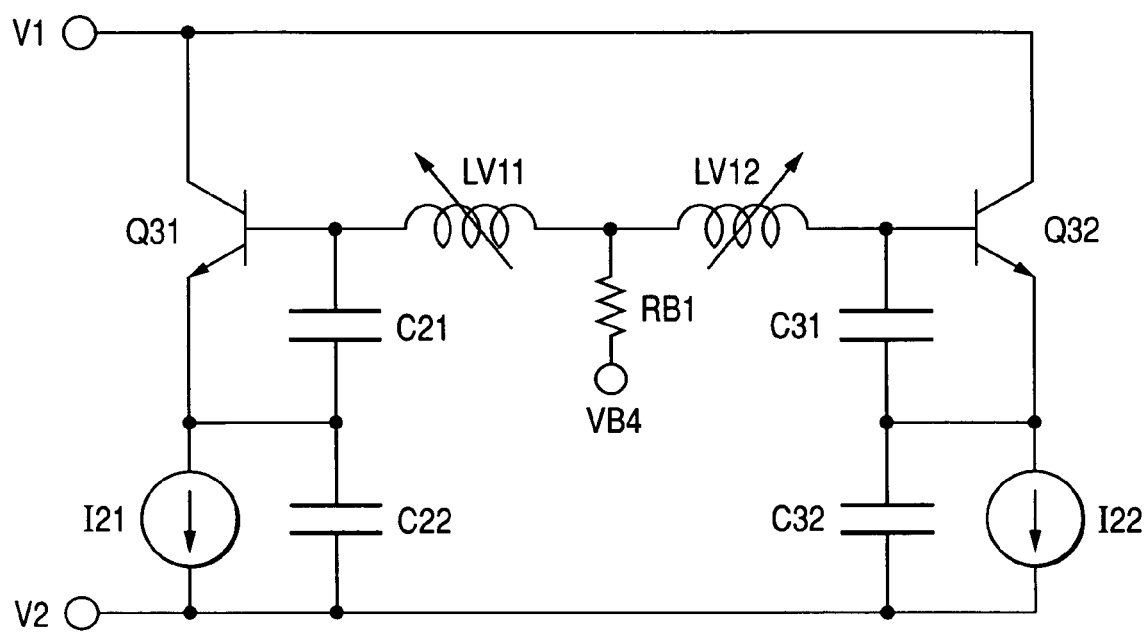
FIG. 15 is a circuit diagram of a ninth embodiment of an oscillator according to the invention.

FIG. 15 is a circuit diagram of a ninth embodiment by an oscillator according to the invention. The oscillator according to the present embodiment has the configuration of the well-known differential Colpitts oscillator. With the present embodiment, one part of the differential Colpitts oscillator, includes a bipolar transistor Q31 having a collector connected to a first constant voltage terminal V1, and an emitter connected to a second constant voltage terminal V2 via a first constant current source I21, a capacitor C21 having one end connected to a base of the bipolar transistor Q31, and the other end connected to the emitter of the bipolar transistor Q31, a capacitor C22 having one end connected to the emitter of the bipolar transistor Q31, and the other end connected to the second constant voltage terminal V2, and a variable inductor LV11 identical to any of the variable inductors, as previously described with reference to the first to fifth embodiments, respectively, connected to the base of the bipolar transistor Q31. The other part of the differential Colpitts oscillator, includes a bipolar transistor Q32 identical in size to the bipolar transistor Q31, having a collector connected to the first constant voltage terminal V1, and an emitter connected to the second constant voltage terminal V2 via a second constant current source I22, a capacitor C31 identical in capacitance to the capacitor C21, having one end connected to a base of the bipolar transistor Q32, and the other end connected to the emitter of the bipolar transistor Q32, a capacitor C32 identical in capacitance to the capacitor C22, having one end connected to the emitter of the bipolar transistor Q32, and the other end connected to the second constant voltage terminal V2, and a variable inductor LV12 identical in inductance to the variable inductor LV11, identical to any of the variable inductors, as previously described with reference to the first to fifth embodiments, respectively, connected to the base of the bipolar transistor Q32. The variable inductors LV11, LV12 each have one end connected to the respective bases of the transistors Q31, Q32, and the other end connected to a common node, the common node being connected, via a resistor RB1, to a terminal VB4 where a fixed bias voltage is inputted.

With this configuration, it is possible to control an oscillation frequency by controlling respective inductances of the variable inductors LV11, LV12. Further, if a variable capacitor is adopted for either the capacitors C21, C31, or the capacitors C22, C32, or both thereof, this will enable a still wider frequency-tuning range to be obtained. Since the oscillator in FIG. 15 is of a differential type, current consumption becomes greater in comparison with that for the Colpitts oscillator of a single-phase type, shown in FIG. 14, however, it is possible to obtain a stable oscillation frequency against a supply voltage.

Tenth Embodiment

Figure 16:
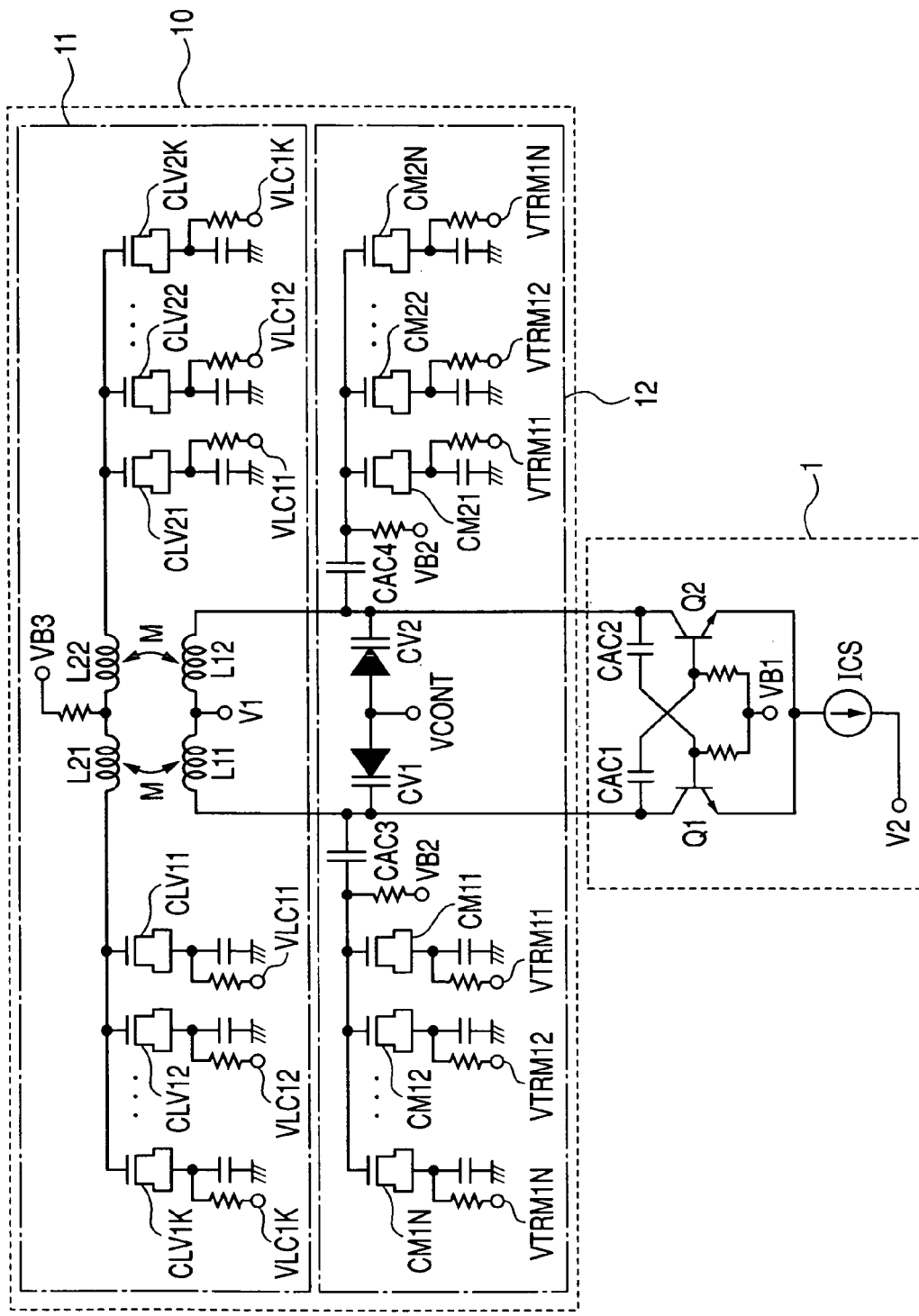
FIG. 16 is a circuit diagram of a tenth embodiment of an oscillator according to the invention.

FIG. 16 is a circuit diagram of a tenth embodiment by an oscillator according to the invention. The oscillator according to the present embodiment includes an LC resonator 10 and a negative conductance generator 1. The resonator 10 comprises a variable inductor 11, and a variable capacitor 12.

The variable inductor 11 comprises inductors L11, L12, inductors L21, L22, magnetically coupled to the inductors L11, L12, respectively, through mutual inductance M, respectively, MOS capacitors CLV11 to CLV1K, and CLV21 to CLV2K (K is a positive integer), connected in parallel to the inductors L21, L22, respectively. A fixed bias voltage is applied to a terminal VB3, and a control voltage is applied to terminals VLC11 to VLC1K, respectively.

The variable capacitor 12 comprises variable capacitor elements CV1, CV2 such as varactor diodes etc., MOS capacitors CM11 to CM1N, and CM21 to CM2N (N is a positive integer), connected together via coupling capacitors CAC3, CAC4, respectively. A fixed bias voltage is applied to terminals VB2, respectively, and a control voltage is applied to terminals VTRM11 to VTRM1N, respectively.

The negative conductance generator 1 comprises a differential pair of bipolar transistors Q1, Q2, having a common emitter connected to a second constant voltage terminal V2 via a constant current source ICS, a capacitor CAC1 having one end connected to a collector of the transistor Q1, and the other end connected to a base of the transistor Q2, and a capacitor CAC2 having one end connected to a collector of the transistor Q2, and the other end connected to a base of the transistor Q1. The respective collectors of the transistors Q1, Q2 are connected to the LC resonator 10, electric power is supplied from a first constant voltage terminal V1 and the second constant voltage terminal V2 to the negative conductance generator 1, and a fixed bias voltage is supplied from a terminal VB1.

A frequency control voltage is applied to a frequency-tuning terminal VCONT for the variable capacitor elements CV1, CV2, thereby controlling an oscillation frequency. Frequency-control voltages at two different values are applied to the frequency-tuning terminals VTRM11 to VTRM1N for the MOS capacitors CM11 to CM1N, and CM21 to CM2N, respectively. The oscillation frequency is thereby controlled stepwise. Inductance-control voltages at two values are applied to the terminals for inductance-control, VLC11 to VLC1K for the MOS capacitors CLV11 to CLV1K, and CLV21 to CLV2K, respectively. Inductance is thereby controlled stepwise, so that the oscillation frequency is controlled stepwise. Thus, the oscillator according to the present embodiment acts as a voltage-controlled oscillator capable of implementing frequency-control by voltage.

Now, the operation of the circuit configured as above, shown in FIG. 16, is described hereinafter.

The oscillation frequency of the oscillator in FIG. 16 is expressed by the following expression (13):

$$f_{OSC} = \frac{1}{2\pi\sqrt{L_{eff}(C_V + C_M + C_P)}} \quad (13)$$

where $C_V$, $C_M$, $C_p$, $L_{eff}$ denote capacitance of the varactor diodes CV1, CV2, capacitance of the MOS capacitors CM11 to CM1N, and CM21 to CM2N, capacitance of metal interconnect parasitic capacitance, and effective inductance, respectively. Assuming that the MOS capacitors CM11 to CM1N are, for example, two MOS capacitors (N=2), capacitances of the two MOS capacitors are $C_{M1}$, $C_{M2}$, respectively, and as to the respective maximum values $C_{M1/MAX}$, and $C_{M2/MAX}$ of $C_{M1}$, $C_{M2}$, the following formula hold; $C_{M2/MAX}=2\times C_{M1/MAX}$, it then becomes possible to obtain capacitances at four different values by changing over between the respective capacitances of the two MOS capacitors. In such a case, the oscillation frequency's dependency on the control voltage at the terminal VCONT is indicated by solid lines in FIG. 17.

Further, let us assume that the MOS capacitors CLV11 to CLV1K, for rendering inductance variable, are two units of MOS capacitors (K=2), and respective capacitances of the two MOS capacitors are $C_{LV1}$, $C_{LV2}$. Assuming that as to the respective capacitances, the following formula hold; $C_{LV2/MAX}=2\times C_{LV1/MAX}$, similarly to the case of the MOS capacitors CM11 to CM1N, it becomes possible to obtain capacitances at four different values by changing over between the respective capacitances of the two MOS capacitors. As a result, it is possible to set four oscillation frequency states against each of four oscillation frequency states that can be changed over by the MOS capacitance $C_M$, as indicated by the solid lines in FIG. 17. The oscillation frequency's dependency on the control voltage at the terminal VCONT, at that point in time, is indicated by dotted lines in FIG. 17.

Figure 17:
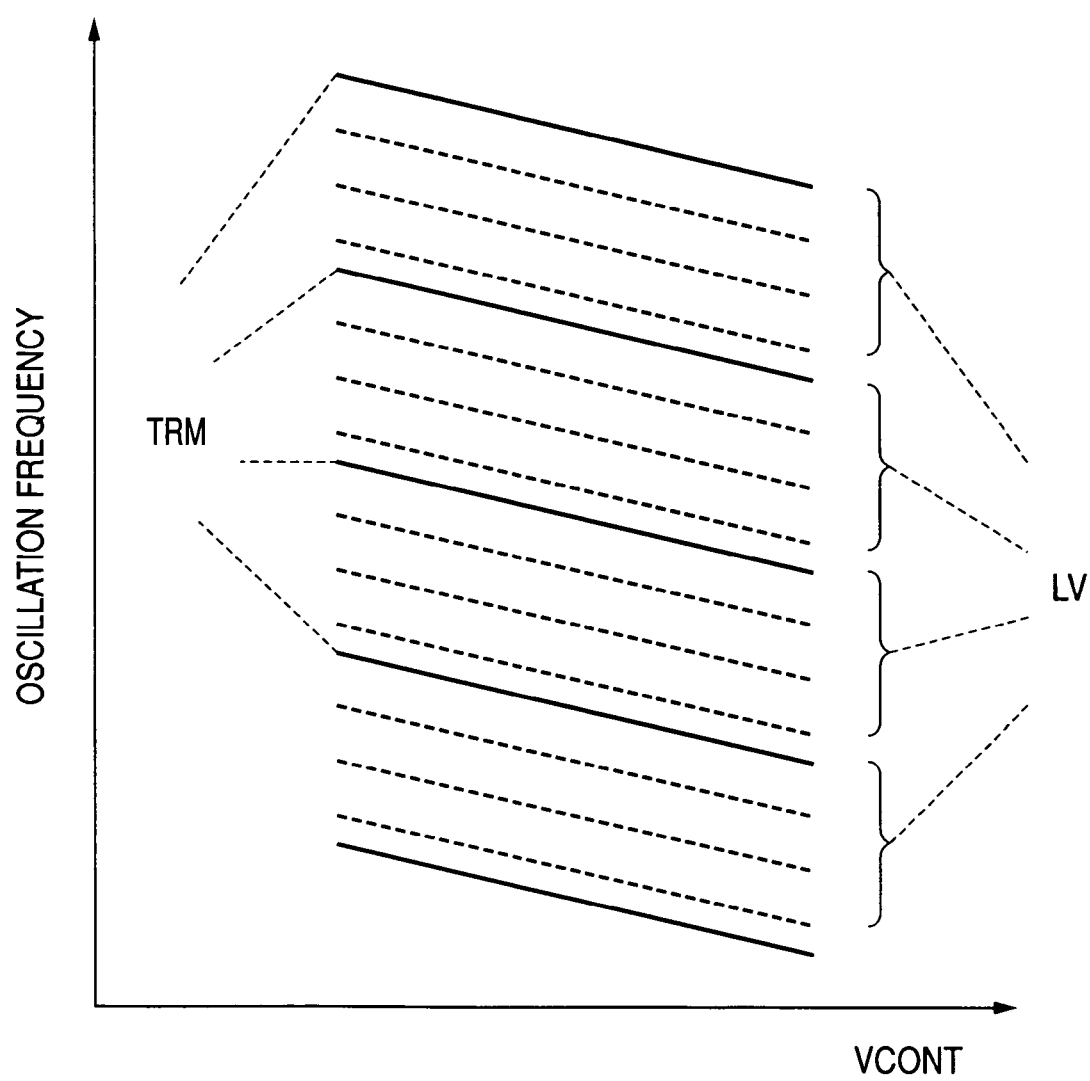
FIG. 17 is a diagrammatic view illustrating frequency control characteristics for an eleventh embodiment of an oscillator according to the invention.

In this connection, a frequency-tuning range obtained through frequency tuning by the conventional varactor diodes CV1, CV2, and MOS capacitors CM11 to CM1N is limited to between the respective four solid lines in FIG. 17. Even if the MOS capacitors CM11 to CM1N are further subdivided (N is increased), frequency will be simply subdivided between the respective solid lines.

In contrast, in the case of the present embodiment, with addition of frequency changeover by use of the variable inductor, it is possible to expand a frequency-tuning range as compared with the conventional frequency-tuning range, as shown in FIG. 17. An expansion ratio will be in the range of 1.3 to 2 times.

A diagrammatic view of FIG. 17 represents the case of changeover being executed in total 16 states by combining changeover in 4 states by the MOS capacitance $C_M$ with changeover in 4 states by the MOS capacitance $C_{LV}$. Now, a state of changeover by the MOS capacitance $C_M$, and a state of changeover by the MOS capacitance $C_{LV}$ are designated hereinafter as (CM, CLV), respectively, and changeover of the oscillation frequency in total 16 states described as above is designated (CM, CLV)=(4, 4). It goes without saying that the changeover of the oscillation frequency can include changeover in 4 states such as, for example, (CM, CLV)=(2, 2), changeover in 8 states such as (CM, CLV)=(2, 4), (4, 2), changeover in 16 states such as (CM, CLV)=(2, 8), (4, 4), (8, 2), changeover in 32 states such as (CM, CLV)=(2, 16), (4, 8), (8, 4), (16, 2), changeover in 64 states such as (CM, CLV)=(2, 32), (4, 16), (8, 8), (16, 4), or (32, 2), changeover in 128 states such as (CM, CLV)=(2, 64), (4, 32), (8, 16), (16, 8), (32, 4), (64, 2), changeover in 256 states such as (CM, CLV)=(2, 128), (4, 64), (8, 32), (16, 16), (32, 8), (64, 4) (128, 2) besides the total 16 states described as above. By executing changeover in excess of 16 states, it is possible to cause the frequency changeover to be rendered finer subdivided changeover.

Figure 18:
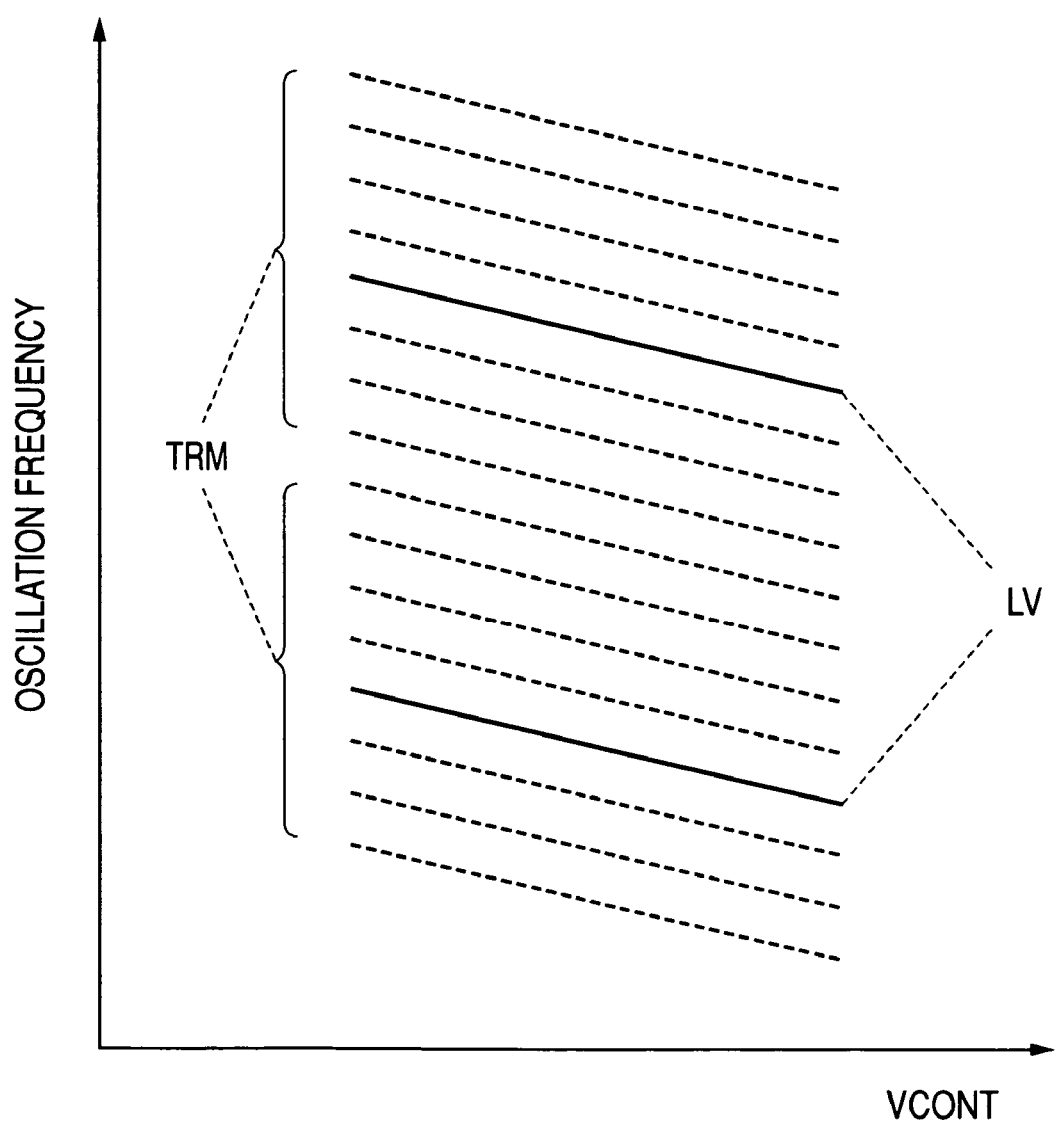
FIG. 18 is another diagrammatic view illustrating the frequency control characteristics for the eleventh embodiment of the oscillator according to the invention.

The above represents the embodiment in the case where the inductance is subdivided between the points A and B in FIG. 3, and if the inductance is subdivided between the points A and E in FIG. 3, this will enable the frequency to be changed over in a wider range. Further, it is possible to change over the frequency between two values at the points A, and E in FIG. 3. In this case, assuming that, for example, K=1, and if capacitance is changed over between the points A, E, the frequency can be changed over as indicated by solid lines in FIG. 18. Further, an assumption is made that N=2, and respective capacitances of 3 units of the MOS capacitors are $C_{M1}$, $C_{M2}$, $C_{M3}$. Still further, an assumption is made that $C_{M2/MAX}=2\times C_{M1/MAX}$, $C_{M3/MAX}=4\times C_{M21/MAX}$. Then, by changing over between the respective capacitances of the 3 units of the MOS capacitors, it becomes possible to obtain capacitances at eight values. Accordingly, it is possible to set eight frequency states against each of two frequency states that are changed over by the variable inductor in FIG. 18. The oscillation frequency's dependency on the control voltage at the terminal VCONT, at that point in time, is indicated by dotted lines in FIG. 18. In the case of such a change over of frequency, quality factor is degraded because the inductance decreases at the point E in FIG. 3, however, because inductance's dependency on capacitance is small in the vicinity of the points A, and E in FIG. 3, it is possible to execute stable frequency changeover against variation in capacitance due to process deviation, and so forth. FIG. 18 is a diagrammatic view showing the case where 3 units of the MOS capacitors CM are adopted to thereby execute changeover in total 16 states, however, more finely subdivided MOS capacitance $C_M$ may be set to thereby execute finer changeover in 32, 64, 128, or 256 states.

Eleventh Embodiment

Figure 19:
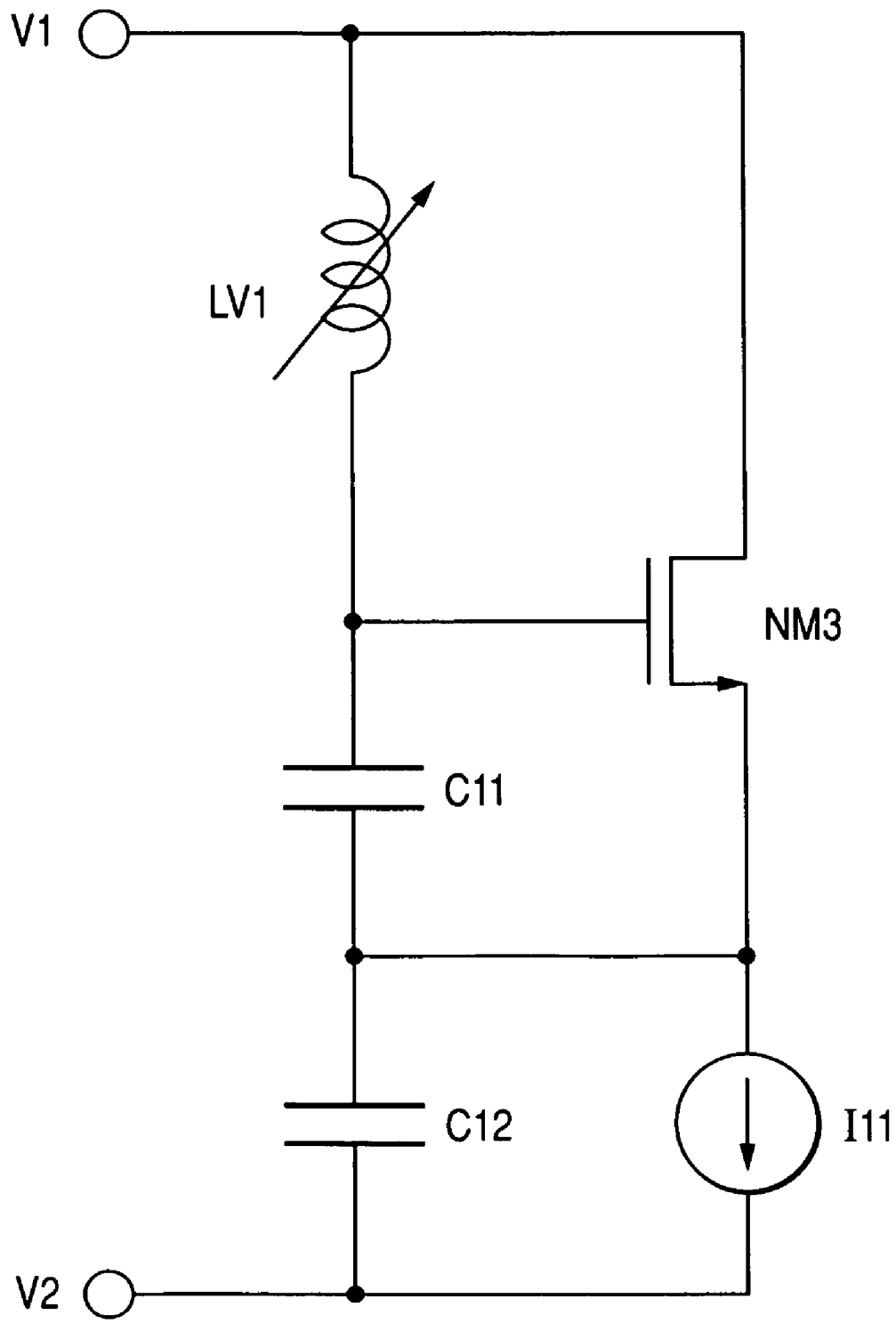
FIG. 19 is a circuit diagram of the eleventh embodiment of the oscillator according to the invention.

FIG. 19 is a circuit diagram of an eleventh embodiment by an oscillator according to the invention. As with the oscillator according to the eighth embodiment shown in FIG. 14, the oscillator according to the present embodiment has a configuration of an example of the Colpitts oscillator, however, with the present embodiment, a MOS transistor is employed in place of the bipolar transistor. The oscillator according to the present embodiment includes an nMOS transistor NM3 having a drain connected to a first constant voltage terminal V1, and a source connected to a second constant voltage terminal V2 via a constant current source I11, a capacitor C11 having one end connected to a gate of the transistor NM3, and the other end connected to the source of the transistor NM3, a capacitor C12 having one end connected to the source of the transistor NM3, and the other end connected to the second constant voltage terminal V2, and a variable inductor LV1 having one end connected to the gate of the transistor NM3, and the other end connected to the first constant voltage terminal V1, identical to any of the variable inductors, as previously described with reference to the first to fifth embodiments, respectively.

By controlling inductance of the variable inductor LV1, an oscillation frequency can be controlled. Further, by substituting a variable capacitor for either the capacitor C11 or the capacitor C12, or both, it is possible to obtain a wider frequency-tuning range. The oscillator shown in FIG. 19 is advantageous in that since the same is operated in a single phase, operation can be carried out without high current consumption. Further, in contrast to the oscillator shown in FIG. 14, using the bipolar transistor, in which case a supply voltage necessary for operation of the oscillator in FIG. 14 is, for example, 3V, the supply voltage for the present embodiment can be reduced down to about 2.5V due to adoption of the MOS transistor provided that the threshold voltage Vth of the MOS transistor is 0.4 V.

Now, the bipolar transistor as previously described and the MOS transistor according to the present embodiment can be called merely as a transistor in a generic name. In this case, the base and the gate are each called an input terminal, the collector and the drain an output terminal, and the emitter and the source a grounded terminal.

Twelfth Embodiment

Figure 20:
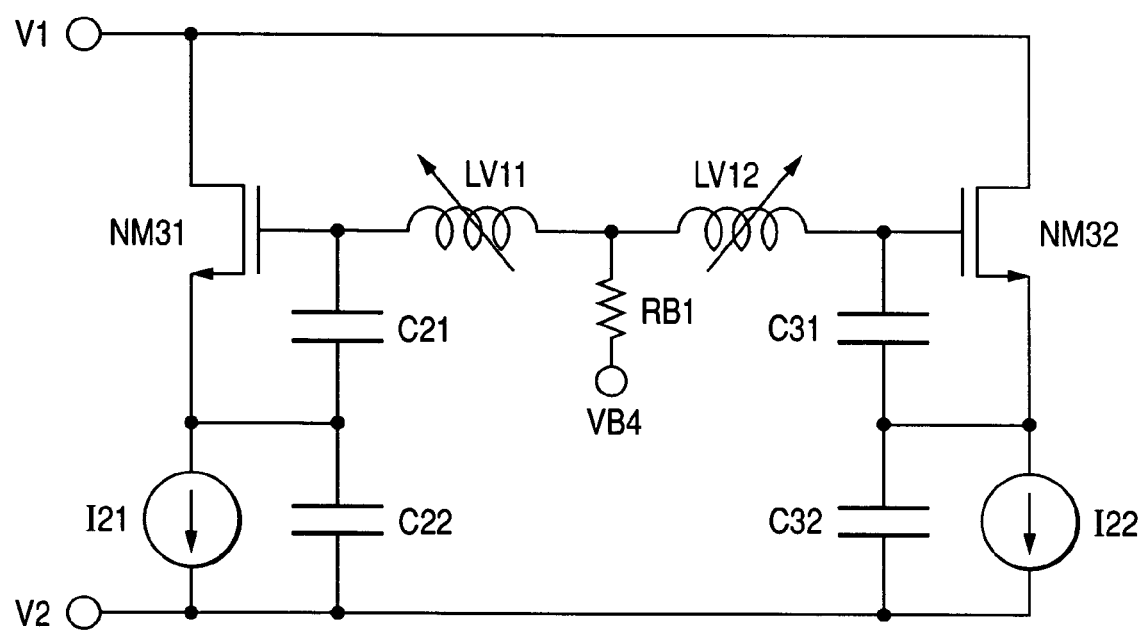
FIG. 20 is a circuit diagram of a twelfth embodiment of an oscillator according to the invention.

FIG. 20 is a circuit diagram of a twelfth embodiment of an oscillator according to the invention. As with the oscillator according to the ninth embodiment shown in FIG. 15, the oscillator according to the present embodiment has a configuration of an example of the differential Colpitts oscillator, however, with the present embodiment, a MOS transistor is employed in place of the bipolar transistor. With the present embodiment, one part of the differential Colpitts oscillator, includes an nMOS transistor NM31 having a drain connected to a first constant voltage terminal V1, and a source connected to a second constant voltage terminal V2 via a first constant current source I21, a capacitor C21 having one end connected to a gate of the transistor NM31, and the other end connected to the source of the transistor NM31, a capacitor C22 having one end connected to the source of the transistor NM31, and the other end connected to the second constant voltage terminal V2, and a variable inductor LV11 identical to any of the variable inductors, as previously described with reference to the first to fifth embodiments, respectively, connected to the gate of the transistor NM31. The other part of the differential Colpitts oscillator, includes an nMOS transistor NM32 identical in size to the transistor NM31, having a drain connected to the first constant voltage terminal V1, and a source connected to the second constant voltage terminal V2 via a second constant current source I22, a capacitor C31 identical in capacitance to the capacitor C21, having one end connected to a gate of the transistor NM32, and the other end connected to the source of the transistor NM32, a capacitor C32 identical in capacitance to the capacitor C22, having one end connected to the source of the transistor NM32, and the other end connected to the second constant voltage terminal V2, and a variable inductor LV12 identical in inductance to the variable inductor LV11, identical to any of the variable inductors, as previously described with reference to the first to fifth embodiments, respectively, having one end connected to the gate of the transistor NM32. The variable inductor LV11, LV12 each have one end connected to the gates of the transistors NM31, NM32, respectively, having the other end connected to a common node, the common node being connected, via a resistor RB1, to a terminal VB4 where a fixed bias voltage is inputted.

By controlling respective inductances of the variable inductors LV11, LV12, an oscillation frequency can be controlled. Further, if a variable capacitor is substituted for a combination of the capacitors C21, C31 or a combination of the capacitors C22, C32, or both the combinations, it is possible to obtain a wider frequency-tuning range. Since the oscillator shown in FIG. 20 is of a differential type, current consumption increases as compared with the Colpitts oscillator of a single-phase type, shown in FIG. 19, however, it is possible to obtain a stable oscillation frequency against the supply voltage. Further, in contrast to the oscillator shown in FIG. 15, using the bipolar transistors, in which case a supply voltage necessary for operation of the oscillator in FIG. 15 is, for example, 3V, the supply voltage for the present embodiment can be reduced down to about 2.5V due to adoption of the MOS transistors provided that the threshold voltage Vth of each of the MOS transistors is 0.4 V.

Thirteenth Embodiment

Figure 21:
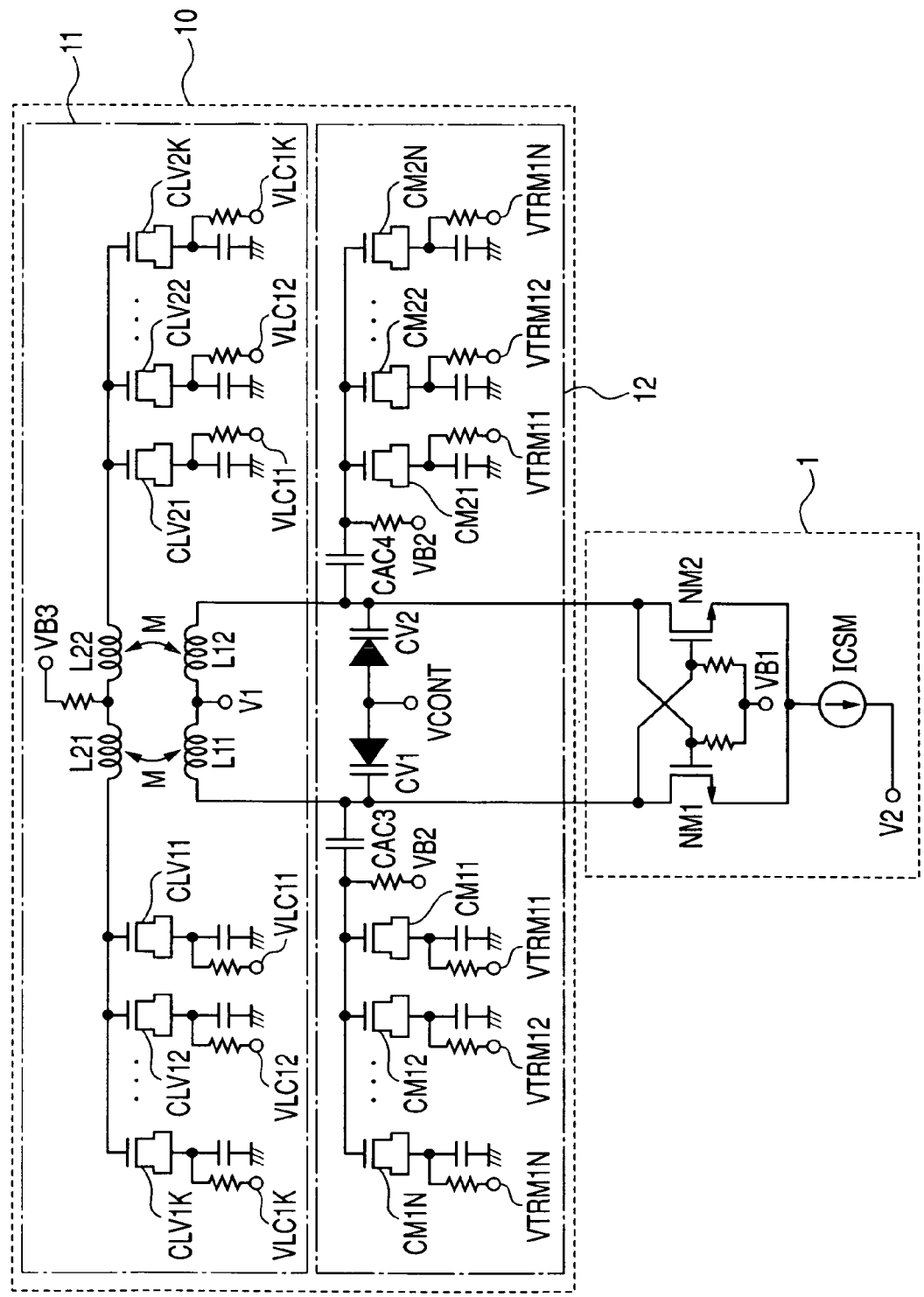
FIG. 21 is a circuit diagram of a thirteenth embodiment of an oscillator according to the invention.

FIG. 21 is a circuit diagram of a thirteenth embodiment by an oscillator according to the invention. As with the oscillator according to the tenth embodiment, shown in FIG. 16, the present embodiment represents an example of an oscillator employing an LC resonator 10 and a negative conductance generator 1, however, MOS transistors are employed in place of the bipolar transistors. The LC resonator 10 comprises a variable inductor 11, and a variable capacitor 12.

The variable inductor 11 comprises inductors L11, L12, inductors L21, L22, magnetically coupled to the inductors L11, L12, respectively, through mutual inductance M, respectively, MOS capacitors CLV11 to CLV1K, and MOS capacitors CLV21 to CLV2K (K is a positive integer), coupled in parallel to the inductors L21, L22, respectively. A fixed bias voltage is applied to a terminal VB3, and a control voltage is applied to terminals VLC11 to VLC1K.

The variable capacitor 12 comprises variable capacitor elements CV1, CV2 such as varactor diodes etc., MOS capacitors CM11 to CM1N, connected together via a coupling capacitor CAC3, and CM21 to CM2N (N is a positive integer), connected together via a coupling capacitor CAC4. A fixed bias voltage is applied to terminals VB2, and a control voltage is applied to terminals VTRM11 to VTRM1N.

The negative conductance generator 1 comprises a pair of differential nMOS transistors NM1, NM2, sharing a source connected to a second constant voltage terminal V2 via a constant current source ICSM. The transistor NM1 has a gate connected to a drain of the transistor NM2, and the transistor NM2 has a gate connected to a drain of the transistor NM1. The respective drains of the transistor NM1, NM2 are connected to the LC resonator 10, and electric power is supplied from a first constant voltage terminal V1, and the second constant voltage terminal V2, respectively, to the negative conductance generator 1.

A frequency control voltage is applied to a frequency-tuning terminal VCONT for the variable capacitor elements CV1, CV2, thereby controlling an oscillation frequency. Frequency-control voltages at two different values are applied to the frequency-tuning terminals VTRM11 to VTRM1N for the MOS capacitors CM11 to CM1N, and CM21 to CM2N, respectively. The oscillation frequency is thereby controlled stepwise. Inductance-control voltages at two different values are applied to the inductance-control terminals VLC11 to VLC1K for the MOS capacitors CLV11 to CLV1K, and CLV21 to CLV2K, respectively. Inductance is thereby controlled stepwise, so that the oscillation frequency is controlled stepwise.

In contrast to the oscillator shown in FIG. 16, using the bipolar transistors, in which case a supply voltage necessary for operation of the oscillator in FIG. 16 is, for example, 3V, the supply voltage for the oscillator in FIG. 21 can be reduced down to about 2.5V due to adoption of the MOS transistors provided that the threshold voltage Vth of each of the MOS transistors is 0.4 V.

Fourteenth Embodiment

Figure 22:
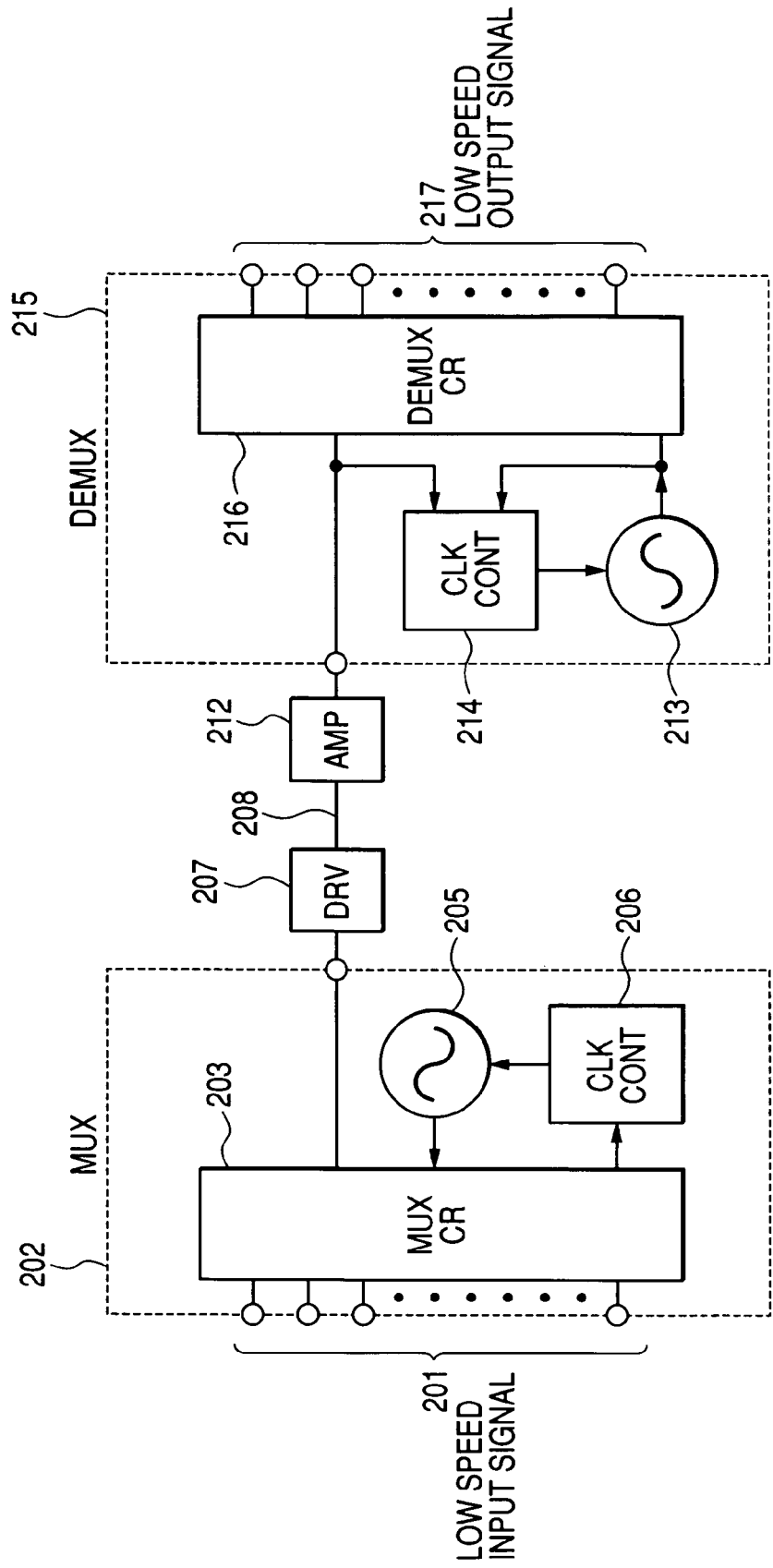
FIG. 22 is a block diagram showing a fourteenth embodiment of a communication system according to the invention.

FIG. 22 is a block diagram showing a fourteenth embodiment by a communication system comprising an oscillator, according to the invention. The communication system according to the present embodiment is a high-speed serial transmission system. The system comprises a transmitter for multiplexing a plurality of low-speed signals before outputting a serial high-speed signal, and a receiver for receiving and demultiplexing the serial high-speed signal as transmitted before outputting the plurality of low-speed signals obtained by demultiplexing.

The transmitter comprises a multiplexer (MUX) 202 for receiving the plurality of low-speed signals, and outputting the serial high-speed signal, and a driver (DRV) 207 for amplifying the serial high-speed signal, and driving a transmission line 208. The receiver comprises an amplifier 212 for amplifying the high-speed signal transmitted via the transmission line 208, and a demultiplexer (DEMUX) 215 for demultiplexing the high-speed signal into the plurality of low-speed signals before outputting.

The multiplexer 202 comprises a MUX (Multiplexer) core (MUX CR) 203 for multiplexing the plurality of low-speed signals inputted to a terminal 201 into the serial high-speed signal, a clock controller (CLK CONT) 206, and an oscillator 205 for generating a reference signal of the MUX core 203, according to the present invention.

The demultiplexer 215 comprises a DEMUX (Demultiplexer) core (DEMUX CR) 216 for demultiplexing the serial high-speed signal into the plurality of low-speed signals before outputting the same to a terminal 217, a clock controller 214, and an oscillator 213 for generating a reference signal of the DEMUX core 216, according to the present invention.

With the use of an oscillator identical to any of the oscillators, as previously described with reference to the sixth to thirteenth embodiments, respectively, for the oscillators 205, 213, it is possible to obtain a wider frequency-tuning range for the oscillators 205, 213, respectively. Consequently, a range of permissible process deviation is expanded, resulting in enhancement in yield, so that it is possible to lower a manufacturing cost of the high-speed serial transmission system.

Fifteenth Embodiment

Figure 23:
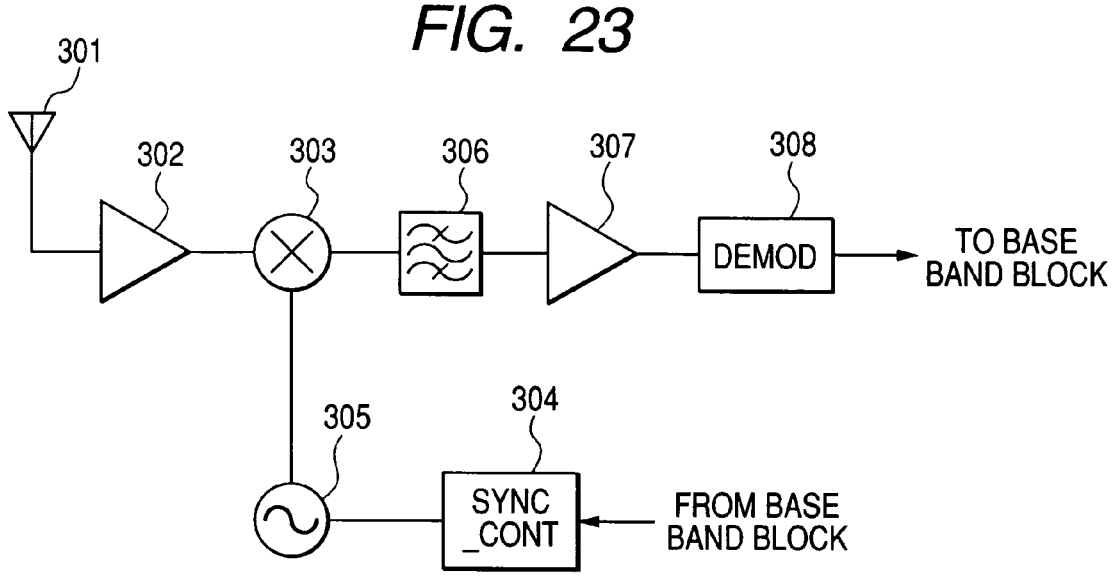
FIG. 23 is a block diagram showing a fifteenth embodiment of a communication system according to the invention.

FIG. 23 is a block diagram showing a fifteenth embodiment by a communication system comprising an oscillator, according to the invention. The communication system according to the present embodiment is a heterodyne wireless receiver. In FIG. 23, a receive signal received by an antenna 301 is amplified by an amplifier 302 to be then delivered to a mixer 303. A local oscillator signal outputted by the oscillator 305 according to the present invention, under control of an oscillator controller (SYNC_CONT) 304, is inputted to the mixer 303 as one of input signals thereof, and then in the output of the mixer 303, a carrier frequency of the receive signal is rendered lower to thereby obtain a receive signal at an intermediate frequency (IF). The IF receive signal has unnecessary frequency components thereof to be attenuated through a band-pass filter 306 to be then amplified by an IF amplifier 307 before being taken out as a base band signal at a demodulator (DEMOD) 308. The base band signal is sent out to an external base band block (not shown). A control signal is sent out from the base band block to the oscillator controller 304.

With the use of an oscillator identical to any of the oscillators, as previously described with reference to the sixth to thirteenth embodiments, respectively, for the oscillator 305, it is possible to obtain a wider frequency-tuning range for the oscillator 305, so that a range of permissible process deviation is expanded, resulting in enhancement in yield. Furthermore, because the oscillator 305 can cope with a plurality of applications and communication systems, it becomes possible to lower a manufacturing cost of the heterodyne wireless receiver.

Sixteenth Embodiment

Figure 24:
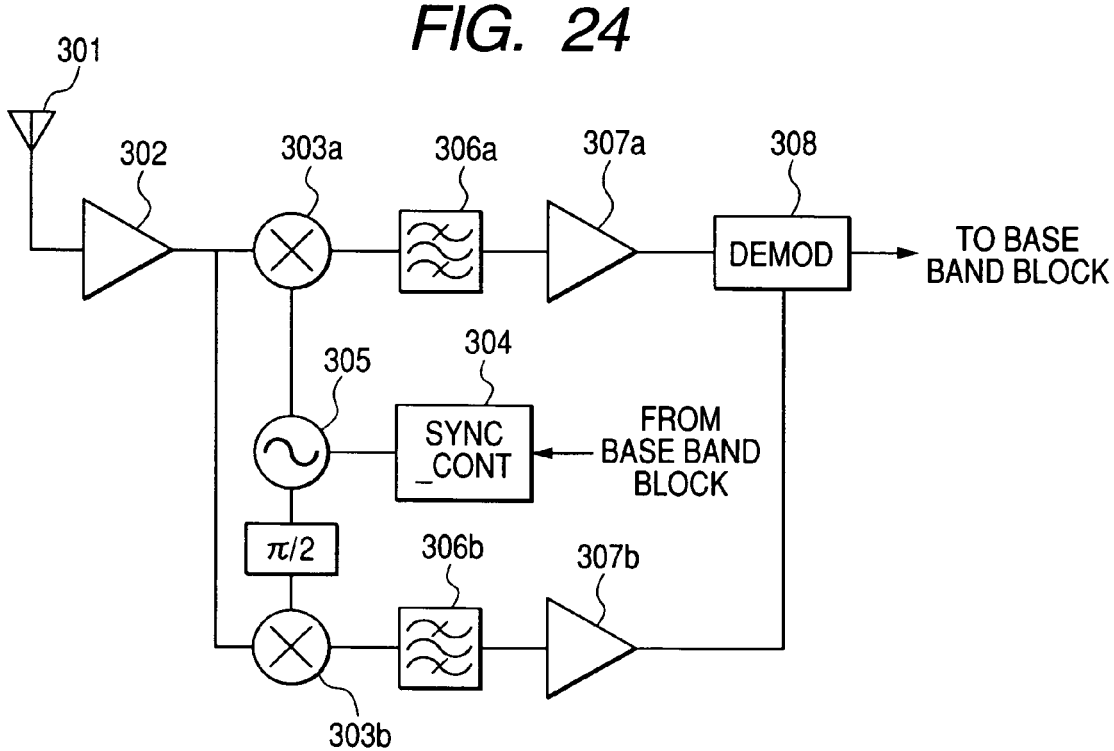
FIG. 24 is a block diagram showing a sixteenth embodiment of a communication system according to the invention.

FIG. 24 is a block diagram showing a sixteenth embodiment by a communication system including an oscillator according to the invention. The communication system according to the present embodiment is a direct-conversion type wireless receiver. A receive signal received by an antenna 301 is amplified by an amplifier 302 to be then delivered to two units of mixers 303a, and 303b. A local oscillator signal outputted by the oscillator 305 according to the present invention, under control of an oscillator controller 304, is divided into two components with a 90° (π/2) phase difference from each other to be inputted to the mixers 303a, and 303b, respectively. In the respective outputs of the two mixers 303a, and 303b, a carrier frequency of the receive signal amplified by the amplifier 302 is lowered to zero frequency, and unnecessary frequency components thereof are attenuated through band-pass filters 306a, 306b, respectively, before being amplified by amplifiers 307a, 307b, respectively. A base band signal is taken out of output signals of the two amplifiers 307a, 307b by a demodulator 308. The base band signal is sent out to an external base band block (not shown). A control signal is sent out from the base band block to the oscillator controller 304.

Figure 25:
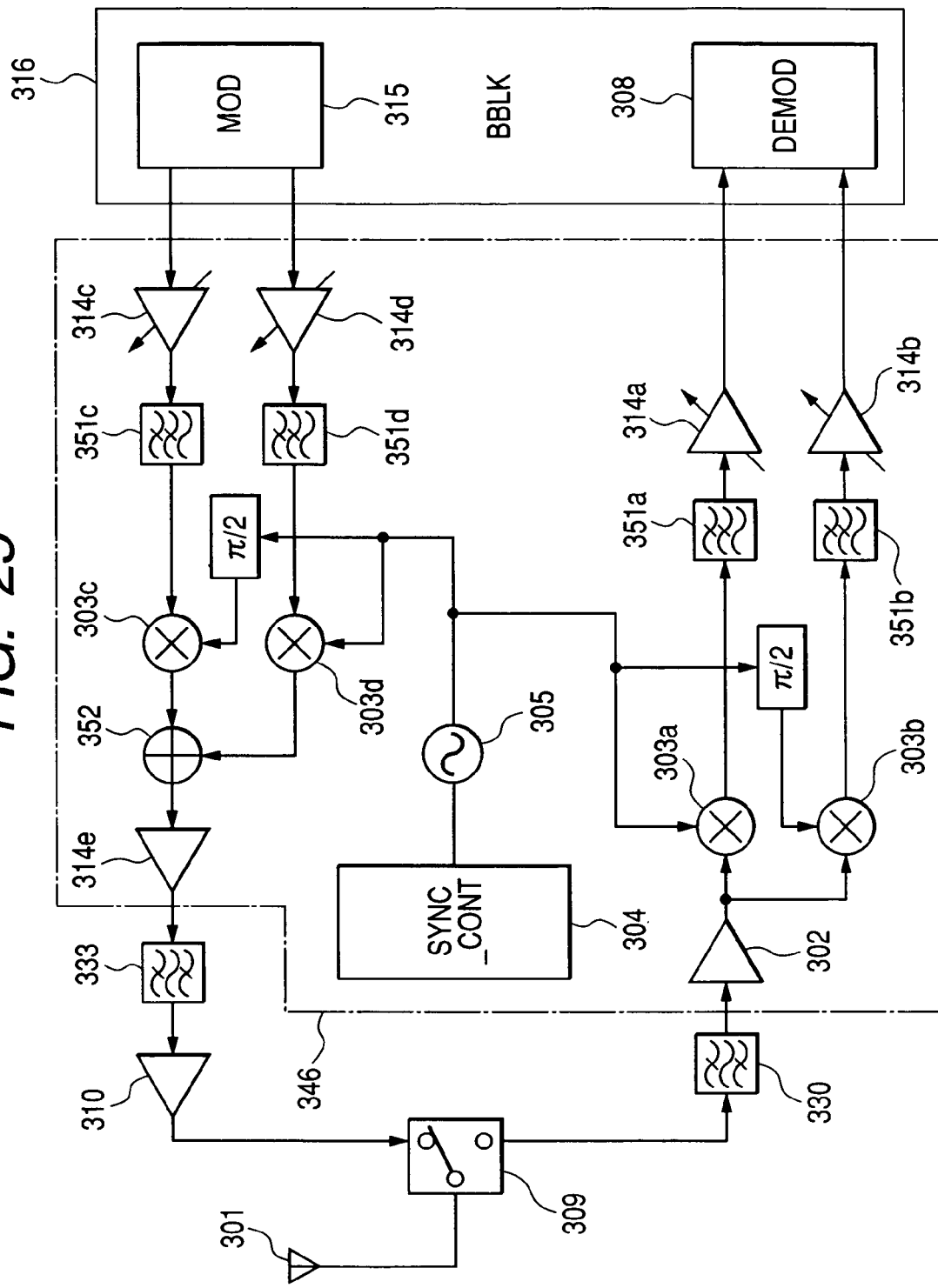
FIG. 25 is a block diagram showing a seventeenth embodiment of a communication system according to the invention.

With the use of an oscillator identical to any of the oscillators, as previously described with reference to the sixth to thirteenth embodiments, respectively, for the oscillator 305, it is possible to obtain a wider frequency-tuning range for the oscillator 305, so that a range of permissible process deviation is expanded, resulting in enhancement in yield. Furthermore, because the oscillator 305 can cope with a plurality of applications and communication systems, it becomes possible to lower a manufacturing cost of the direct-conversion type wireless receiver Seventeenth Embodiment FIG. 25 is a block diagram showing a seventeenth embodiment by a communication system comprising an oscillator, according to the invention. The communication system according to the present embodiment is a direct-conversion type wireless receiver. At the time of receiving, a receive signal received by an antenna 301 and passed through a switch 309 causes unnecessary frequency components thereof to be attenuated by a band-pass filter 330 to be then amplified by a low-noise amplifier 302 before delivered to two units of mixers 303a, and 303b. An RF (radio frequency) local oscillator signal outputted by the oscillator 305 according to the present invention, under control of an oscillator controller 304, is divided into two components with a 90° (π/2) phase difference from each other to be inputted to the mixers 303a, and 303b, respectively. In respective outputs of the two mixers 303a, and 303b, a carrier frequency is lowered to zero frequency, and unnecessary frequency components thereof are attenuated by low-pass filters 351a, 351b, respectively, before being amplified by auto gain-controllable amplifiers 314a, 314b, respectively. Respective outputs of the auto gain-controllable amplifiers 314a, 314b are transmitted to a base band block (BBLK) 316 to be taken out as a receive base band signal by a demodulator 308.

At the time of transmitting, a transmit base band signal outputted by the base band block 316 is modulated by a modulator (MOD) 315 to be then separated into two different signals differing in phase from each other by 90°. The two signals as separated are amplified by auto gain-controllable amplifiers 314c, 314d, respectively, and unnecessary frequency components thereof are attenuated by low-pass filters 351c, 351d, respectively, before being inputted to mixers 303c, 303d, respectively. The RF local oscillator signal outputted by the oscillator 305 according to the present invention, under control of the oscillator controller 304, is divided into two components with a 90° (π/2) phase difference from each other to be inputted to the mixers 303c, and 303d, respectively. Respective outputs of the two mixers 303c, and 303d are added up by an adder 352 to be then turned into an RF orthogonal modulation signal. The RF orthogonal modulation signal is amplified by an auto gain-controllable amplifier 314e to be further amplified by a high power amplifier 310 after unnecessary frequency components thereof are attenuated by a band-pass filter 333, and is sent out to the antenna via the switch 309 to be thereby transmitted.

With the use of an oscillator identical to any of the oscillators, as previously described with reference to the sixth to thirteenth embodiments, respectively, for the oscillator 305, it is possible to obtain a wider frequency-tuning range for the oscillator 305, so that a range of permissible process deviation is expanded, resulting in enhancement in yield. Furthermore, because the oscillator 305 can cope with a plurality of applications and communication systems, it becomes possible to lower a manufacturing cost of the direct-conversion type wireless receiver.

Further, for the oscillator 305, use is made of the variable inductor according to the invention, suited for integration. Accordingly, in FIG. 25, a circuit on a receiving side, from the low-noise amplifier 302 to the auto gain-controllable amplifiers 314a, 314b, a circuit on a transmitting side, from the auto gain-controllable amplifiers 314c, 314d to the auto gain-controllable amplifier 314e, and a transmitting and receiving circuit 346 including the oscillator controller 304, and the oscillator 305 can be easily made up as a semiconductor device, that is, an RF-IC (Radio Frequency-Integrated Circuit) formed on-one and the same semiconductor substrate. In addition, the oscillator 305 has a wide oscillation-frequency-tuning range, and yet low phase noise. Accordingly, the RF-IC is suited for application to a multi-band•multi-mode wireless transmitting and receiving apparatus that is singly capable of coping with, for example, a plurality of communication systems using a plurality of frequency bands.

Eighteenth Embodiment

Figure 26:
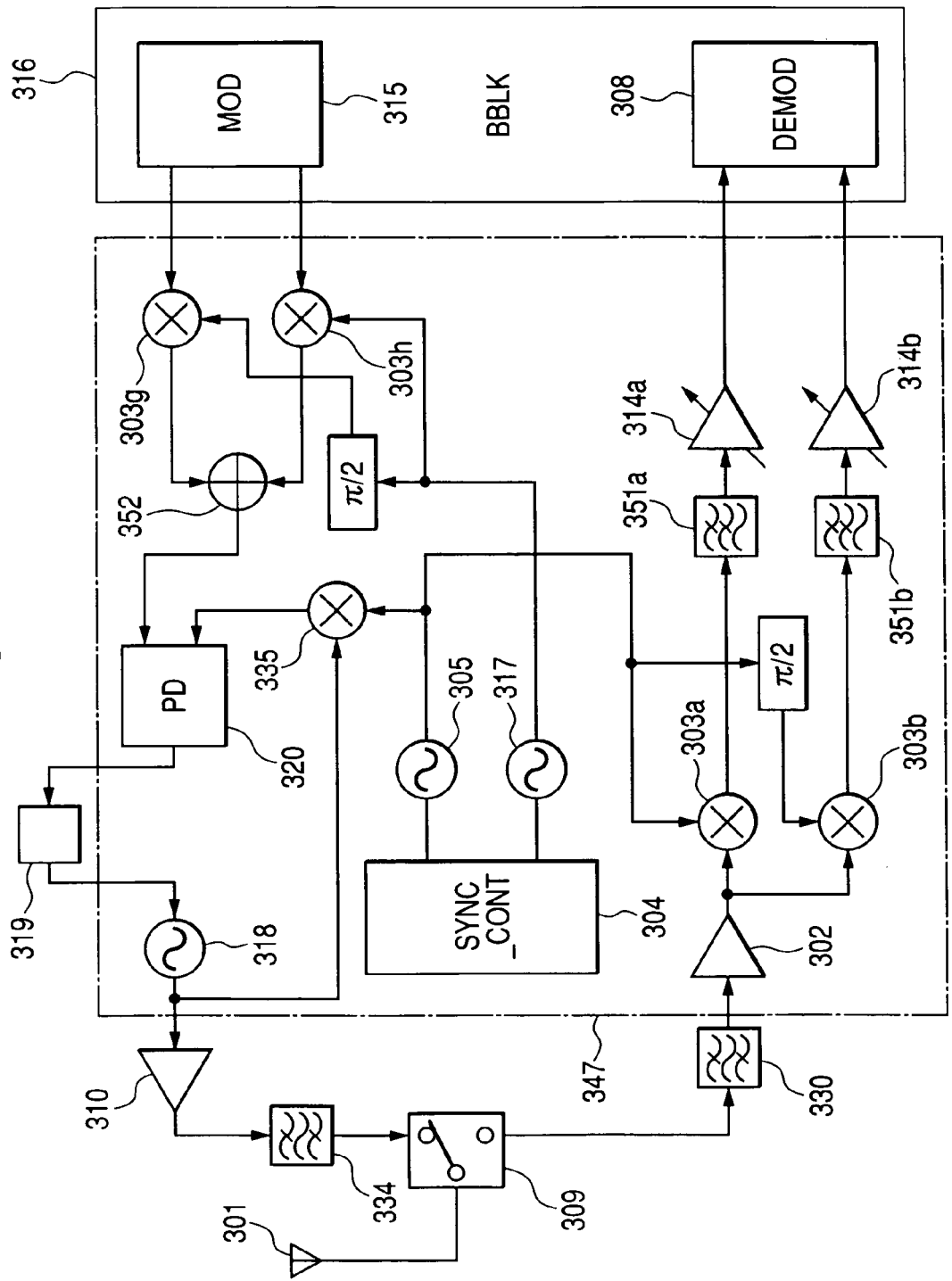
FIG. 26 is a block diagram showing an eighteenth embodiment of a communication system according to the invention.

FIG. 26 is a block diagram showing an eighteenth embodiment by a communication system comprising an oscillator, according to the invention. The communication system according to the present embodiment is another direct-conversion type wireless receiver differing in configuration from that according to the seventeenth embodiment. At the time of receiving, a receive signal received by an antenna 301 and passed through a switch 309 causes unnecessary frequency components thereof to be attenuated by a band-pass filter 330 to be then amplified by a low-noise amplifier 302 before delivered to two units of mixers 303a, and 303b. A local oscillator signal outputted by the oscillator 305 according to the present invention, under control of an oscillator controller 304, is divided into two components with a 90° (π/2) phase difference from each other to be inputted to the mixers 303a, and 303b, respectively. In respective outputs of the two mixers 303a, and 303b, a carrier frequency is lowered to zero frequency, and unnecessary frequency components thereof are attenuated by low-pass filters 351a, 351b, respectively, before being amplified by auto gain-controllable amplifiers 314a, 314b, respectively. Respective outputs of the auto gain-controllable amplifiers 314a, 314b are transmitted to a base band block (BBLK) 316 to be then taken out as a receive base band signal by a demodulator 308.

At the time of transmitting, a transmit base band signal outputted by the base band block 316 is modulated by a modulator 315 to be then separated into two different signals differing in phase from each other by 90°. The two signals as separated are inputted to mixers 303g, 303h, respectively. The IF local oscillator signal outputted by the oscillator 317 according to the present invention, under control of the oscillator controller 304, is divided into two components with a 90° (π/2) phase difference from each other to be inputted to the mixers 303g, and 303h, respectively. Respective outputs of the two mixers 303g, and 303h are added up by an adder 352 to be then turned into an IF orthogonal modulation signal. The IF orthogonal modulation signal is compared in phase with an output signal of a mixer 335 by use of a phase comparator (PD) 320. An output signal of the phase comparator 320 is delivered to a frequency-tuning terminal of the oscillator 318 for transmission, according to the present invention, via a loop filter 319. An output signal of the oscillator 318, and the RF local oscillator signal of the oscillator 305 are inputted to the mixer 335, whereupon the output signal of the mixer 335 is inputted to the phase comparator 320, as described above. As a result, the RF orthogonal modulation signal is outputted from the oscillator 318. The RF orthogonal modulation signal is amplified by a high power amplifier 310, and is sent out to the antenna via the switch 309 after unnecessary frequency components thereof are attenuated by a band-pass filter 334 to be thereby transmitted.

With the use of an oscillator identical to any of the oscillators, as previously described with reference to the sixth to thirteenth embodiments, respectively, for the oscillators 305, 317 and 318, it is possible to obtain a wider frequency-tuning range for each of those oscillators, so that a range of permissible process deviation is expanded, resulting in enhancement in yield. Furthermore, because the respective oscillators can cope with a plurality of applications and communication systems, it becomes possible to lower a manufacturing cost of the direct-conversion type wireless receiver.

Further, for each of the oscillators 305, 317, and 318, use is made of the variable inductor according to the invention, suited for integration. Accordingly, in FIG. 26, a circuit on a receiving side, from the low-noise amplifier 302 to the auto gain-controllable amplifiers 314a, 314b, a circuit on a transmitting side, from the mixers 303g, and 303h to the oscillator 318 excluding the loop filter 319, and a transmit-receive circuit including the oscillator controller 304, and the oscillators 305, 317, 318 can be easily made up as a semiconductor device, that is, an RF-IC formed on one and the same semiconductor substrate. In addition, the oscillators 305, 317, 318 each have a wide oscillation-frequency-tuning range, and yet low phase noise. Accordingly, the RF-IC is suited for application to a multi-band·multi-mode wireless transceiver that is singly capable of coping with, for example, a plurality of communication protocols using a plurality of frequency bands.

Nineteenth Embodiment

Figure 29:
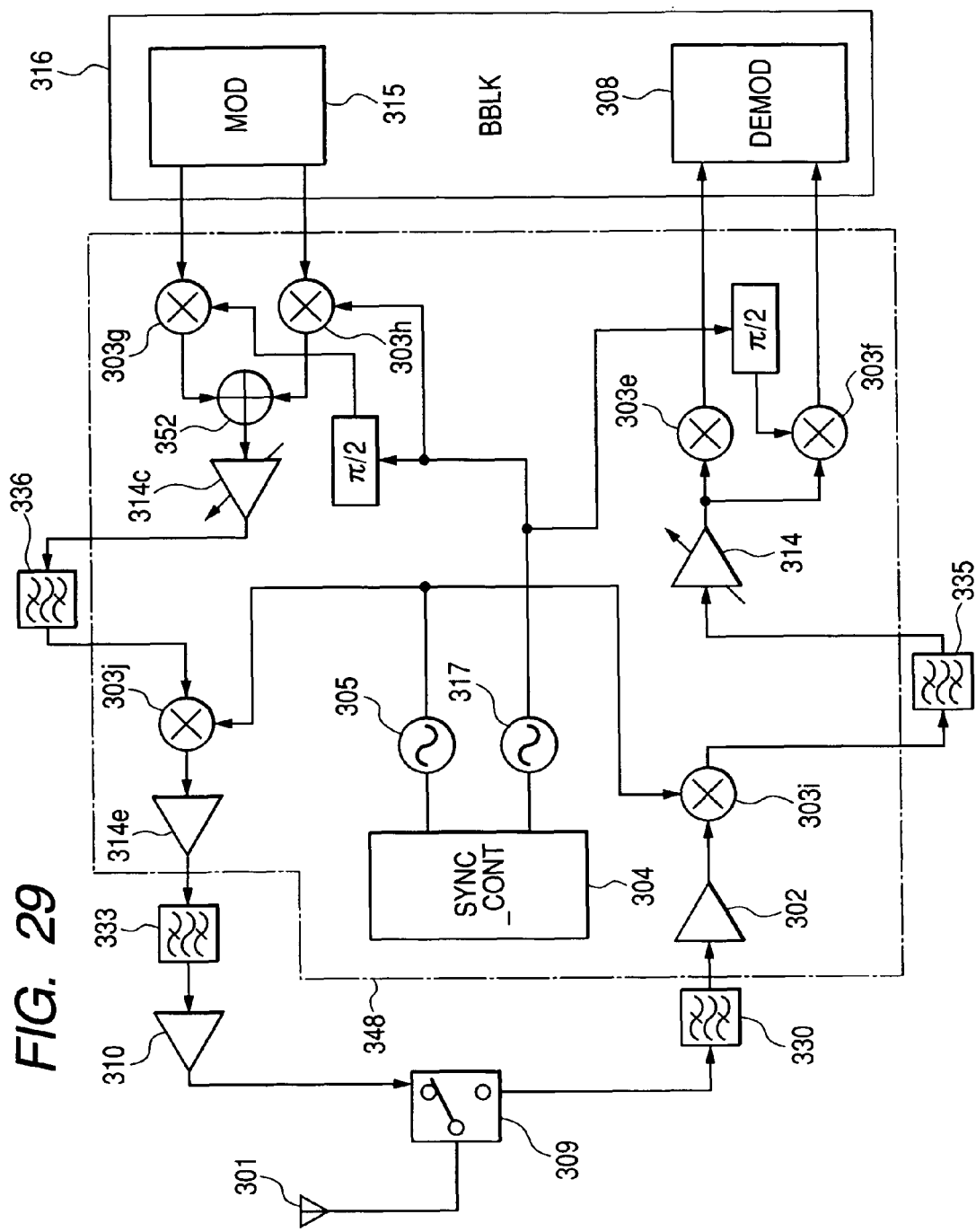
FIG. 29 is a block diagram showing a nineteenth embodiment of a communication system according to the invention.

FIG. 29 is a block diagram showing a nineteenth embodiment by a communication system comprising an oscillator, according to the invention. The communication system according to the present embodiment is a heterodyne wireless receiver. At the time of receiving, a receive signal received by an antenna 301 and passed through a switch 309 causes unnecessary frequency components thereof to be attenuated by a band-pass filter 330 to be then amplified by a low-noise amplifier 302 before delivered to a mixer 303i. An RF local oscillator signal outputted by the oscillator 305 according to the present invention, under control of an oscillator controller 304, is delivered to the mixer 303i. In an output of the mixer 303i, a carrier frequency of the receive signal is lowered to zero frequency, and a receive signal at an intermediate frequency is obtained. An output signal of the mixer 303i has unnecessary frequency components, which are attenuated by a low-pass filter 335 to be then amplified by an auto gain-controllable amplifier 314 before being inputted to two units of mixers 303e, and 303f, respectively. An IF local oscillator signal outputted by the oscillator 317 according to the present invention, under control of an oscillator controller 304, is divided into two components with a 90° (π/2) phase difference from each other to be inputted to the mixers 303e, and 303f, respectively. Respective outputs of the two mixers 303e, and 303f are transmitted to a base band block (BBLK) 316 to be taken out as a receive base band signal by a demodulator 308.

At the time of transmitting, a transmit base band signal outputted by the base band block 316 is modulated by a modulator (MOD) 315 to be then separated into two different signals differing in phase from each other by 90°. The two signals as separated are inputted to mixers 303g, and 303h, respectively. The IF local oscillator signal outputted by the oscillator 317 according to the present invention, under control of the oscillator controller 304, is divided into two components with a 90° (π/2) phase difference from each other to be inputted to the mixers 303g, and 303h, respectively. Respective outputs of the two mixers 303g, and 303h are added up by an adder 352 to be then turned into an IF orthogonal modulation signal. The IF orthogonal modulation signal is amplified by an auto gain-controllable amplifier 314c to be then inputted to a mixer 303j after unnecessary frequency components thereof are attenuated by a band-pass filter 336. An RF local oscillator signal outputted by the oscillator 305 according to the present invention, under control of the oscillator controller 304, is inputted to the mixer 303j. An output of the mixer 303j is amplified by an auto gain-controllable amplifier 314e to be further amplified by a high power amplifier 310 after unnecessary frequency components thereof are attenuated by a band-pass filter 333, and is sent out to the antenna via the switch 309 to be thereby transmitted.

With the use of an oscillator identical to any of the oscillators, as previously described with reference to the sixth to thirteenth embodiments, respectively, for the oscillators 305, 317, it is possible to obtain a wider frequency-tuning range for each of those oscillators, so that a range of permissible process deviation is expanded, resulting in enhancement in yield. Furthermore, because the respective oscillators can cope with a plurality of applications and communication systems, it becomes possible to lower a manufacturing cost of the heterodyne wireless receiver.

Further, for each of the oscillators 305, 317, and 318, use is made of the variable inductor according to the invention, suited for integration. Accordingly, in FIG. 29, a circuit on a receiving side, from the low-noise amplifier 302 to the mixers 303e, and 303f, excluding the band-pass filter 336, a circuit on a transmitting side, from the mixers 303g, and 303h to the auto gain-controllable amplifier 314e, excluding the band-pass filter 336, and a transmit-receive circuit including the oscillator controller 304, and the oscillators 305, 317 can be easily made up as a semiconductor device, that is, an RF-IC (Radio Frequency-Integrated Circuit) formed on one and the same semiconductor substrate. In addition, the oscillators 305, 317 each have a wide oscillation-frequency-tuning range, and yet low phase noise. Accordingly, the RF-IC is suited for application to a multi-band-multi-mode wireless transceiver that is singly capable of coping with, for example, a plurality of communication protocols using a plurality of frequency bands.

Twentieth Embodiment

Figure 27:
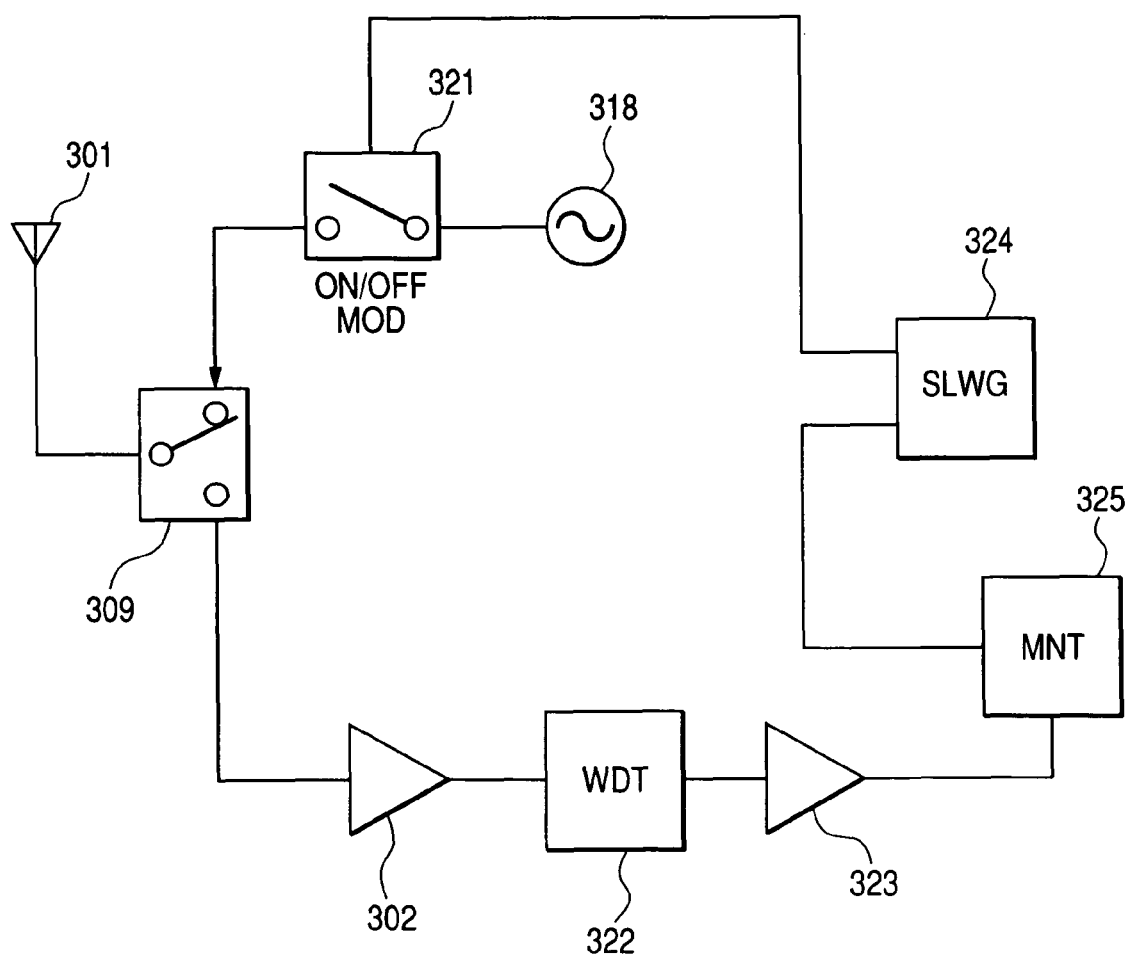
FIG. 27 is a block diagram showing a twentieth embodiment of a communication system according to the invention.
Figure 28:
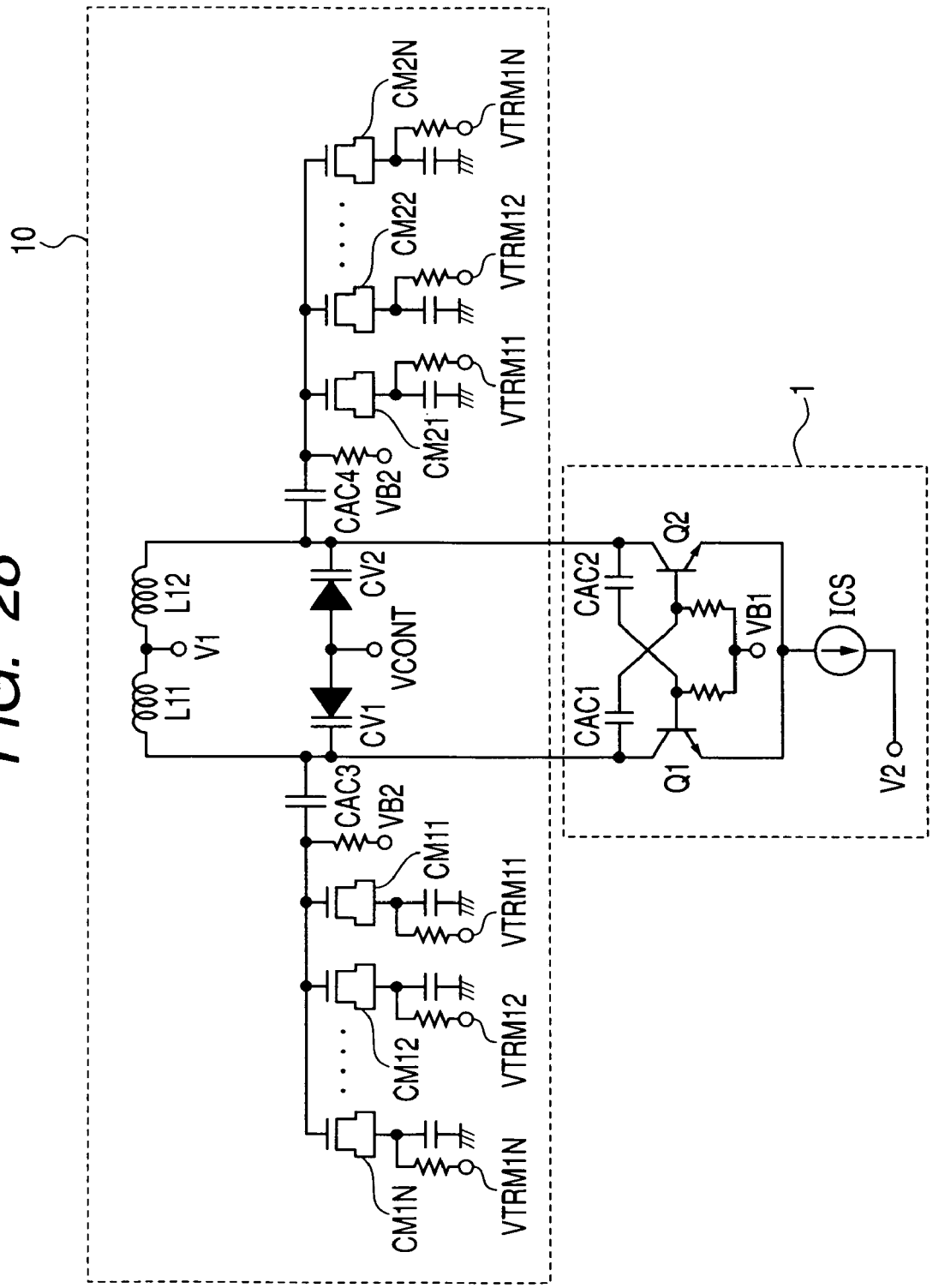
FIG. 28 is a circuit diagram showing an example of a common oscillator.

FIG. 27 is a block diagram showing a twentieth embodiment by a communication system comprising an oscillator, according to the invention. The communication system according to the present embodiment is a wireless radar transceiver of a pulse radar type. At the time of transmitting, an output signal of the oscillator 318 according to the present invention is modulated by an ON/OFF modulator (ON/OFF MOD) 321 that is opened and closed by an output of a sawtooth wave generator (SLWG) 324, and is transmitted from an antenna 301 via a switch 309.

At the time of receiving, a receive signal received by the antenna 301 and passed through the switch 309 is amplified by a low-noise amplifier 302, and is detected by a wave detector (WDT) 322. A detected signal is amplified by a video amplifier 323 to be then displayed on a screen of a monitor (MNT) 325

With the use of an oscillator identical to any of the oscillators, as previously described with reference to the sixth to thirteenth embodiments, respectively, for the oscillator 318, it is possible to obtain a wider frequency-tuning range for the oscillator 318, so that a range of permissible process deviation is expanded, and enhancement in yield is therefore achieved, thereby enabling a manufacturing cost of the wireless radar transceiver of the pulse radar type.

Further, it is not that advantageous effects of the present invention, obtained by any of the third to twentieth embodiments, occur only when the bipolar transistor, or the MOS transistor is used in an element circuit thereof, but that similar advantageous effects can be obtained even if the bipolar transistor, or the MOS transistor is replaced with a field effect transistor, a heterojunction bipolar transistor, or a high electron mobility transistor, and needless to say, similar advantageous effects can be obtained even if a p-type semiconductor and an n-type semiconductor are interchanged in a device.

With the present invention, the reactance device with a variable device value, such as, for example, a variable capacitor, is connected to the secondary inductor magnetically coupled to the primary inductor through mutual inductance M, so that there is a high hope for implementation of a variable inductor with little degradation in quality factor.

It is further understood by those skilled in the art that the foregoing description is a preferred embodiment of the disclosed device and that various changes and modifications may be made in the invention without departing from the spirit and scope thereof.

What is claimed is:

1. An oscillator comprising:
   a resonator including an inductor and a capacitor connected in parallel; and
   a negative conductance generator for generating negative conductance, the negative conductance generator being connected to the resonator,
   wherein said oscillator outputs a signal whose frequency is substantially determined by a resonance frequency of the resonator;
   wherein the inductor is a variable inductor whose inductance varies,
   wherein the resonance frequency of the resonator varies as a result of the variation in the inductance; and
   wherein said variable inductor comprises:
   a first inductor;
   a second inductor magnetically coupled to the first inductor through mutual inductance; and
   an inductance controller comprising a reactance device, the inductance controller being connected to the second inductor,
   wherein the inductance controller has an inductance control terminal for receiving a control signal for varying a device value of the reactance device, and as a result of variation in the device value of the reactance device, caused by the control signal, inductance of the first inductor varies,
   wherein the reactance device is a second variable capacitor whose capacitance is varied by the control signal,
   wherein the capacitor is a first variable capacitor whose capacitance varies and the resonance frequency of the resonator varies as a result of the variation in the capacitance,
   wherein the second variable capacitor comprises a plurality of parallel-coupled variable capacitors whose capacitance is varied by the control signal, and
   wherein the entire range of the capacitance of the second variable capacitor due to which the inductance of the first inductor shows a value continuously changing from the highest to the lowest with increase of the capacitance of the second variable capacitor is excluded from use as providing a degraded quality factor through the first variable capacitor and the second variable capacitor working in cooperation with each other so as to prevent degradation of the quality factor caused by the continuously changing value in the inductance from the highest to the lowest.

2. The oscillator according to claim 1, wherein the negative conductance generator comprises:
   two units of transistors;
   an input terminal of one of the transistors being mutually connected to an output terminal of the other transistor while respective grounded terminals of both the transistors are connected with each other; and
   a constant current source being connected to a node connecting the respective grounded terminals.

3. A communication system comprising:
   a low-noise amplifier for amplifying a receive signal received by an antenna;
   a mixer for converting a frequency of an output signal of the low-noise amplifier;
   an oscillator for generating a local oscillator signal for conversion of the frequency, and outputting the local oscillator signal to the mixer;
   a demodulator for taking out a receive base band signal from an output signal of the mixer;
   a modulator for modulating a transmit base band signal and outputting two signals orthogonal in phase to each other;
   an orthogonal modulator for modulating the two signals orthogonal in phase to each other by use of the local oscillator signal outputted by the oscillator to thereby output an orthogonal modulation signal;
   a power amplifier for amplifying the orthogonal modulation signal; and
   a switch for supplying the receive signal received from the antenna to the low-noise amplifier at the time of receiving and supplying the orthogonal modulation signal outputted by the power amplifier to the antenna at the time of transmitting,
   wherein said oscillator comprises:
   a resonator including an inductor and a capacitor connected in parallel; and
   a negative conductance generator for generating negative conductance, the negative conductance generator being connected to the resonator,
   wherein said oscillator outputs a signal whose frequency is substantially determined by a resonance frequency of the resonator;
   wherein the inductor is a variable inductor whose inductance varies,
   wherein the resonance frequency of the resonator varies as a result of the variation in the inductance; and wherein said variable inductor comprises:

a first inductor;

a second inductor magnetically coupled to the first inductor through mutual inductance; and an inductance controller comprising a reactance device, the inductance controller being connected to the second inductor, wherein the inductance controller has an inductance control terminal for receiving a control signal for varying a device value of the reactance device, and as a result of variation in the device value of the reactance device, caused by the control signal, inductance of the first inductor varies, wherein the reactance device is a second variable capacitor whose capacitance is varied by the control signal, wherein the capacitor is a first variable capacitor whose capacitance varies and the resonance frequency of the resonator varies as a result of the variation in the capacitance, wherein the second variable capacitor comprises a plurality of parallel-coupled variable capacitors whose capacitance is varied by the control signal, and wherein the entire range of the capacitance of the second variable capacitor due to which the inductance of the first inductor shows a value continuously changing from the highest to the lowest with increase of the capacitance of the second variable capacitor is excluded from use as providing a degraded quality factor through the first variable capacitor and the second variable capacitor working in cooperation with each other so as to prevent degradation of the quality factor caused by the continuously changing value in the inductance from the highest to the lowest.

4. The communication system according to claim 3, wherein a transmitting and receiving circuit comprising the low-noise amplifier, the mixer, the oscillator, the demodulator, the modulator and the orthogonal modulator is configured as a semiconductor device.

5. The oscillator according to claim 1, wherein the capacitance of the first variable capacitor, the inductance of the first inductor and the capacitance of the second variable capacitor have an interrelationship such that as the capacitance of the first variable capacitor increases, the dependence of the inductance of the first inductor on the capacitance of the second variable capacitor also increases.

6. The communication system according to claim 3, wherein the capacitance of the first variable capacitor, the inductance of the first inductor and the capacitance of the second variable capacitor have an interrelationship such that as the capacitance of the first variable capacitor increases, the dependence of the inductance of the first inductor on the capacitance of the second variable capacitor also increases.

7. The oscillator according to claim 1,
wherein the range of the capacitance of the second variable capacitor corresponding to the value continuously changing from the highest to the lowest includes a capacitive region and an inductive region.

8. The communication system according to claim 3,
wherein the range of the capacitance of the second variable capacitor corresponding to the value continuously changing from the highest to the lowest includes a capacitive region and an inductive region.

* * * * *